United States Patent
Yamaji et al.

(10) Patent No.: US 12,334,937 B2
(45) Date of Patent: Jun. 17, 2025

(54) SEMICONDUCTOR INTEGRATED CIRCUIT, ELECTRONIC DEVICE, AND CONTROL METHOD FOR SEMICONDUCTOR INTEGRATED CIRCUIT

(71) Applicant: SONY SEMICONDUCTOR SOLUTIONS CORPORATION, Kanagawa (JP)

(72) Inventors: Hideo Yamaji, Kanagawa (JP); Sho Ohashi, Kanagawa (JP); Yinta Lin, Kanagawa (JP); Riichi Nishino, Kanagawa (JP); Yoshinori Takahashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/566,749

(22) PCT Filed: Dec. 28, 2021

(86) PCT No.: PCT/JP2021/048854
§ 371 (c)(1),
(2) Date: Dec. 4, 2023

(87) PCT Pub. No.: WO2022/264462
PCT Pub. Date: Dec. 22, 2022

(65) Prior Publication Data
US 2024/0259024 A1  Aug. 1, 2024

(30) Foreign Application Priority Data
Jun. 15, 2021 (JP) .................................. 2021-099108

(51) Int. Cl.
*H03L 7/081* (2006.01)
*H03L 7/089* (2006.01)
*H03L 7/091* (2006.01)

(52) U.S. Cl.
CPC ............ *H03L 7/081* (2013.01); *H03L 7/0891* (2013.01); *H03L 7/091* (2013.01)

(58) Field of Classification Search
CPC ........ H03L 7/081; H03L 7/0891; H03L 7/091
See application file for complete search history.

(56) References Cited

U.S. PATENT DOCUMENTS 8,149,065 B1 * 4/2012 Tsang .................... H03L 1/02
331/34
9,742,380 B1 * 8/2017 Raj ........................ H03K 7/08
(Continued)

FOREIGN PATENT DOCUMENTS

EP  3190705 A1 * 7/2017 .......... H03D 13/004
JP  03-030518 A   2/1991
(Continued)

OTHER PUBLICATIONS

International Search Report and Written Opinion of PCT Application No. PCT/JP2021/048854, issued on Mar. 22, 2022, 11 pages of ISRWO.

*Primary Examiner* — Adam D Houston
(74) *Attorney, Agent, or Firm* — CHIP LAW GROUP

(57) ABSTRACT

In a circuit provided with a phase comparator, a lock time is shortened.
The phase comparator compares between a phase of a reference clock signal that has been input and a phase of a feedback clock signal, and outputs a comparison result. A charge pump generates a control voltage for control of a frequency of the feedback clock signal on the basis of the comparison result. A feedback unit generates the feedback clock signal in response to the control voltage. A stop (Continued)

detection unit detects whether or not the reference clock signal is stopped, and initializes the comparison result in a case where the reference clock signal is stopped.

17 Claims, 35 Drawing Sheets

(56) References Cited

U.S. PATENT DOCUMENTS

| | | | |
|---|---|---|---|
| 2008/0136535 A1* | 6/2008 | Khorram | H03L 7/193 |
| | | | 331/44 |
| 2011/0221494 A1* | 9/2011 | Chen | H03L 3/00 |
| | | | 327/157 |
| 2014/0021990 A1* | 1/2014 | Na | H03L 7/095 |
| | | | 327/158 |
| 2016/0269033 A1* | 9/2016 | Saito | H03L 7/0807 |
| 2016/0344538 A1* | 11/2016 | Moehlmann | H03L 7/091 |
| 2020/0076439 A1* | 3/2020 | Weeks | H03L 7/0805 |
| 2021/0013888 A1* | 1/2021 | Kim | H03L 7/145 |
| 2024/0223193 A1* | 7/2024 | Wu | H03L 7/095 |

FOREIGN PATENT DOCUMENTS

| | | | |
|---|---|---|---|
| JP | 2002-050958 | A | 2/2002 |
| JP | 2007-295180 | A | 11/2007 |
| JP | 2010-178137 | A | 8/2010 |
| JP | 2012-105049 | A | 5/2012 |
| JP | 2019-176403 | A | 10/2019 |

\* cited by examiner

FIG. 5

| CLR(-) | clk | D | Q |
|---|---|---|---|
| L | X | X | L |
| H | OTHER THAN ↑ | X | HELD |
| H | ↑ | L | L |
| H | ↑ | H | H |

| CLR(–) | clk+, clk– | D | Q |
|---|---|---|---|
| L | X | X | L |
| H | clk+ IS OTHER THAN ↑ OR clk– IS OTHER THAN ↓ | X | HELD |
| H | clk+ IS ↑ AND clk– IS ↓ | L | L |
| H | clk+ IS ↑ AND clk– IS ↓ | H | H |

SEMICONDUCTOR INTEGRATED CIRCUIT, ELECTRONIC DEVICE, AND CONTROL METHOD FOR SEMICONDUCTOR INTEGRATED CIRCUIT

CROSS REFERENCE TO RELATED APPLICATIONS

This application is a U.S. National Phase of International Patent Application No. PCT/JP2021/048854 filed on Dec. 28, 2021, which claims priority benefit of Japanese Patent Application No. JP 2021-099108 filed in the Japan Patent Office on Jun. 15, 2021. Each of the above-referenced applications is hereby incorporated herein by reference in its entirety.

TECHNICAL FIELD

The present technology relates to a semiconductor integrated circuit. More specifically, the present technology relates to a semiconductor integrated circuit, a solid-state imaging element, and a control method for the semiconductor integrated circuit that compare phases of clock signals.

BACKGROUND ART

Conventionally, a delay locked loop (DLL) and a phase locked loop (PLL) are used to generate a clock signal synchronized with a reference clock signal or a base clock signal from a transmission side, in a circuit or the like on a reception side of a communication interface. For example, there has been proposed a PLL provided with: a detection circuit that detects whether or not a base clock signal is stopped and stops a voltage-controlled oscillator when the base clock signal is stopped; a phase comparator; a charge pump; a loop filter; the voltage-controlled oscillator; and a frequency divider (see, for example, Patent Document 1).

CITATION LIST

Patent Document

Patent Document 1: Japanese Patent Application Laid-Open No. 2002-50958

SUMMARY OF THE INVENTION

Problems to be Solved by the Invention

In the related art described above, power consumption is reduced by stopping the voltage-controlled oscillator while the base clock signal is stopped. However, in the PLL described above, since the phase comparator continues to output a comparison result while the base clock is stopped, the loop filter is charged or discharged, and a control voltage input to the voltage-controlled oscillator fluctuates. Therefore, there is a problem that it takes time for the control voltage to return to a level that is of immediately before the stop after elapse of a stop period, and lock time until the output of the PLL is again synchronized (that is, locked) with the base clock signal becomes longer as the stop period is longer.

The present technology has been made in view of such a situation, and an object thereof is to shorten a lock time in a circuit provided with a phase comparator.

Solutions to Problems

The present technology has been made to solve the problem described above, and a first aspect is a semiconductor integrated circuit and a control method for the semiconductor integrated circuit, the semiconductor integrated circuit including: a phase comparator configured to compare between a phase of a reference clock signal that has been input and a phase of a feedback clock signal, and output a comparison result; a charge pump configured to generate a control voltage for control of a frequency of the above-described feedback clock signal on the basis of the above-described comparison result; a feedback unit configured to generate the above-described feedback clock signal in accordance with the above-described control voltage; and a stop detection unit configured to detect whether or not the above-described reference clock signal is stopped, and initialize the above-described comparison result in a case where the above-described reference clock signal is stopped. As a result, there is an effect of shortening a lock time.

Furthermore, in this first aspect, the above-described feedback unit may include a delay unit configured to delay the above-described reference clock signal over a delay time according to the above-described control voltage, and output the above-described reference clock signal as the above-described feedback clock signal. As a result, there is an effect of shortening a lock time in a DLL.

Furthermore, in this first aspect, the above-described comparison result may include a first control signal for increase of the above-described control voltage and a second control signal for decrease of the above-described control voltage, the above-described phase comparator may output one of the above-described first and second control signals, the above-described stop detection unit may include: a pre-stage flip-flop configured to hold the above-described one of the above-described first and second control signals, in synchronization with a clock signal having a delay time different from a delay time of the above-described feedback clock signal; and a reset signal generation circuit configured to generate a reset signal for initialization of the above-described comparison result on the basis of a control signal held in the above-described pre-stage flip-flop and the above-described reference clock signal, and the above-described phase comparator may initialize the above-described comparison result in response to the above-described reset signal. As a result, there is an effect that a reset signal is generated.

Furthermore, in this first aspect, the above-described reset signal generation circuit may include: a delay element configured to delay a control signal held in the above-described pre-stage flip-flop; a post-stage logic gate configured to generate a predetermined detection signal on the basis of the above-described held control signal and the above-described delayed control signal; and a post-stage flip-flop configured to capture and hold a predetermined value in synchronization with the above-described reference clock signal, output the held value as the above-described reset signal, and initialize the above-described held value in response to the above-described predetermined detection signal. As a result, there is an effect that a reset signal is generated.

Furthermore, in this first aspect, the above-described pre-stage flip-flop may output a held control signal as a detection signal, and the above-described reset signal generation circuit may include: a post-stage flip-flop configured to capture and hold the above-described detection signal in synchronization with the above-described reference clock signal; an inverter configured to invert a signal held in the above-described post-stage flip-flop and output the signal as an inverted signal; and a post-stage logic circuit configured to generate the above-described reset signal on the basis of the above-described held detection signal and the above-described inverted signal. As a result, there is an effect that a reset signal is generated.

Furthermore, this first aspect may further include: a pre-stage logic gate configured to input any of the above-described first and second control signals to the above-described pre-stage flip-flop when a predetermined period has elapsed from when the above-described control voltage is an initial value. As a result, there is an effect of preventing erroneous detection at the time of activation.

Furthermore, in this first aspect, the above-described feedback unit may further include a multiplexer configured to select any clock signal from a plurality of clock signals having different delay times, and supply the clock signal to the above-described pre-stage flip-flop. As a result, there is an effect that a clock signal having an appropriate delay time is selected.

Furthermore, in this first aspect, the above-described feedback unit may include a voltage-controlled oscillator configured to generate a clock signal having a frequency according to the above-described control voltage, as the above-described feedback clock signal. As a result, there is an effect of shortening a lock time in the PLL.

Furthermore, in this first aspect, the above-described feedback unit may include: a voltage-controlled oscillator configured to generate a clock signal having a frequency according to the above-described control voltage, and output the clock signal as an output clock signal; and a frequency divider configured to divide a frequency of the above-described output clock signal and output the output clock signal as the above-described feedback clock signal. As a result, there is an effect of shortening a lock time in the PLL.

Furthermore, this first aspect may further include: a voltage correction unit configured to hold, as a held value, the above-described control voltage of when the above-described comparison result is initialized, and correct the above-described control voltage to the above-described held value when a stop period of the above-described reference clock signal has elapsed. As a result, there is an effect that, even when a voltage fluctuates due to a leakage current, the voltage is corrected to a voltage before the fluctuation.

Furthermore, this first aspect may further include: a voltage compensation unit configured to compensate the above-described control voltage on the basis of a fluctuation amount of the above-described control voltage during a stop period of the above-described reference clock signal. As a result, there is an effect that the control voltage becomes the voltage before the fluctuation.

Furthermore, in this first aspect, the above-described voltage compensation unit may include: a replica circuit configured to generate a compensation amount according to the above-described fluctuation amount in the above-described stop period; and an arithmetic unit configured to compensate the above-described control voltage with the above-described compensation amount, when the above-described stop period has elapsed. As a result, there is an effect that the compensation amount is added or subtracted.

Furthermore, in this first aspect, the above-described arithmetic unit may include: an operational amplifier; first and second capacitive elements having one ends connected in common to an input terminal of the above-described operational amplifier; a first switch configured to open and close a path between a control line that supplies the above-described control voltage and another end of the above-described first capacitive element; a second switch configured to open and close a path between the above-described replica circuit and another end of the above-described second capacitive element; a third switch configured to open and close a path between the another end of the above-described first capacitive element and an output terminal of the above-described operational amplifier; a fourth switch configured to open and close a path between the input terminal and the output terminal of the above-described operational amplifier; a fifth switch configured to open and close a path between the another end of the above-described second capacitive element and a predetermined reference potential; and a sixth switch configured to open and close a path between the above-described control line and the output terminal of the above-described operational amplifier. As a result, there is an effect that the compensation amount is added or subtracted.

Furthermore, in this first aspect, the above-described voltage compensation unit may include: a replica circuit configured to generate a compensation amount according to the above-described fluctuation amount in the above-described stop period; and an arithmetic unit configured to compensate the above-described control voltage with the above-described compensation amount, when the above-described stop period has elapsed. As a result, there is an effect of further shortening the lock time.

Furthermore, in this first aspect, the above-described feedback unit may include: a voltage-controlled oscillator configured to generate a clock signal having a frequency according to the above-described control voltage, and output the clock signal as an output clock signal; and a frequency divider configured to divide a frequency of the above-described output clock signal and output the output clock signal as the above-described feedback clock signal. As a result, there is an effect that the voltage is compensated in the PLL.

Furthermore, a second aspect of the present technology is an electronic device including: a phase comparator configured to compare between a phase of a reference clock signal that has been input and a phase of a feedback clock signal, and output a comparison result; a charge pump configured to generate a control voltage for control of a frequency of the above-described feedback clock signal on the basis of the above-described comparison result; a feedback unit configured to generate the above-described feedback clock signal in accordance with the above-described control voltage; a stop detection unit configured to detect whether or not the above-described reference clock signal is stopped, and initialize the above-described comparison result in a case where the above-described reference clock signal is stopped; and a transmission circuit configured to supply the above-described reference clock signal. As a result, there is an effect of shortening a lock time in the electronic device.

BRIEF DESCRIPTION OF DRAWINGS

FIG. 5 is a view illustrating an example of an operation of a flip-flop according to the first embodiment of the present technology.

MODE FOR CARRYING OUT THE INVENTION

Modes for carrying out the present technology (hereinafter, referred to as embodiments) will be described below. The description will be given in the following order.

1. First embodiment (example of initializing control signal when reference clock signal is stopped)
2. Second embodiment (example of initializing control signal when reference clock signal is stopped except during activation)
3. Third embodiment (example of selecting delay time of feedback clock signal and initializing control signal when reference clock signal is stopped)
4. Fourth embodiment (example of initializing control signal when reference clock signal is stopped in phase synchronization circuit)
5. Fifth embodiment (example of initializing control signal and correcting voltage when reference clock signal is stopped)
6. Sixth embodiment (example of compensating voltage)
7. Seventh embodiment (example of compensating voltage when output of comparator is inverted)
8. Eighth embodiment (example of compensating voltage by digital circuit)
9. Ninth embodiment (example of compensating voltage in phase synchronization circuit)
10. Application example to mobile object 1. First Embodiment (Configuration Example of Imaging Device)

Figure 1:
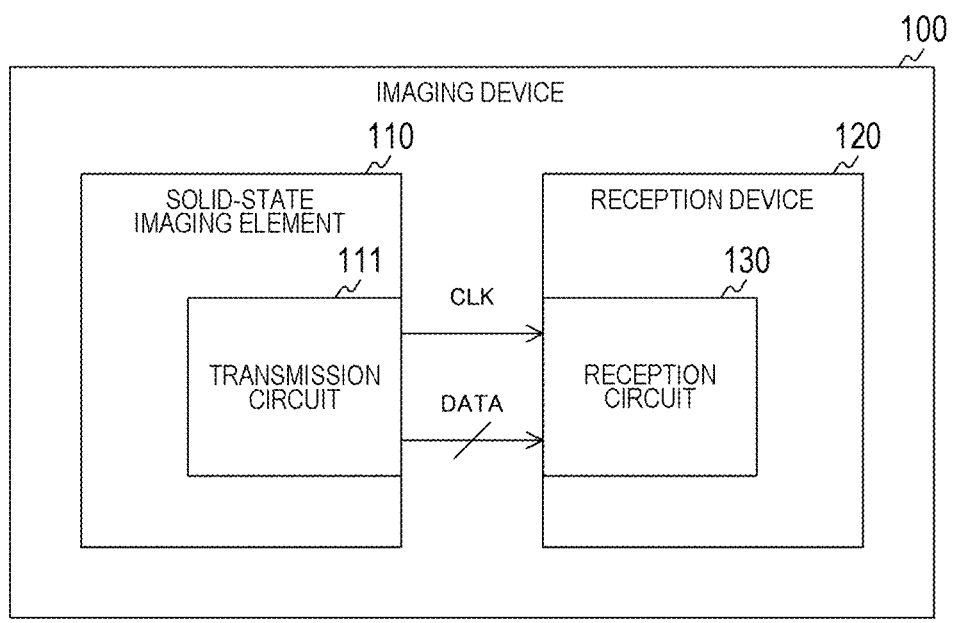
FIG. 1 is a block diagram illustrating a configuration example of an imaging device according to a first embodiment of the present technology.

FIG. 1 is a block diagram illustrating a configuration example of an imaging device 100 according to an embodiment of the present technology. The imaging device 100 is a device that captures image data, and includes a solid-state imaging element 110 and a reception device 120.

The solid-state imaging element 110 generates image data by photoelectric conversion. The solid-state imaging element 110 includes a transmission circuit 111 that transmits image data. This transmission circuit 111 supplies a clock signal CLK and a data signal DATA constituting the image data, to the reception device 120. For example, a mobile industry processor interface (MIPI) is used as a communication interface standard for transmitting these signals. Note that standards other than the MIPI may also be used.

The reception device 120 receives image data, and performs predetermined signal processing on the data. For example, a digital signal processing (DSP) or the like is used as the reception device 120. The reception device 120 includes a reception circuit 130 that receives image data. The reception circuit 130 receives the clock signal CLK and the data signal DATA.

(Configuration Example of Reception Circuit)

Figure 2:
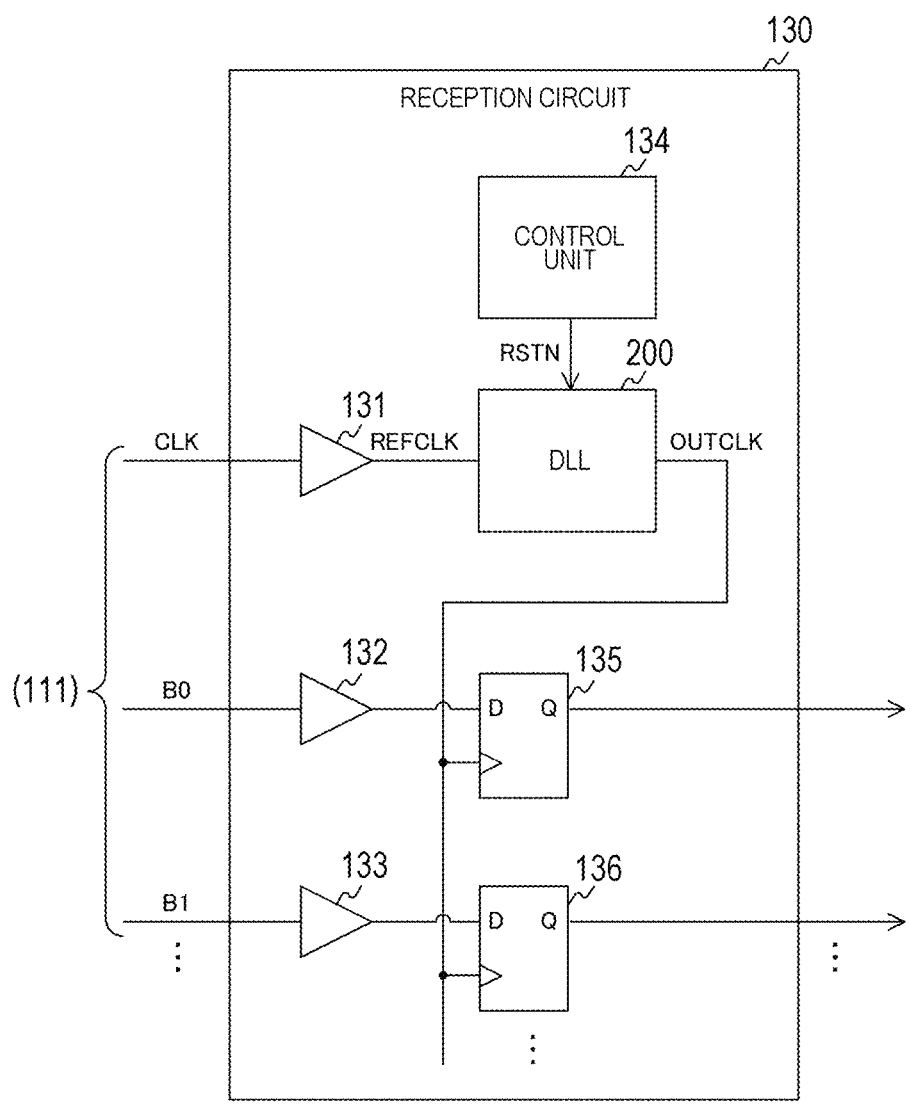
FIG. 2 is a circuit diagram illustrating a configuration example of a reception circuit according to the first embodiment of the present technology.

FIG. 2 is a circuit diagram illustrating a configuration example of the reception circuit 130 according to a first embodiment of the present technology. The reception circuit 130 includes a plurality of receivers such as receivers 131 to 133, a control unit 134, a DLL 200, and a predetermined number of flip-flops such as flip-flops 135 and 136.

The receiver 131 receives the clock signal CLK from the transmission circuit 111, and inputs the clock signal CLK as a reference clock signal REFCLK to the DLL 200. The receiver 132 receives a bit signal B0 in the data signal DATA and inputs the bit signal B0 to the flip-flop 135. The receiver 133 receives a bit signal B1 in the data signal DATA and inputs the bit signal B1 to the flip-flop 136.

The control unit 134 controls an operation of the DLL 200 by using a control signal RSTN. A control content by the control signal RSTN will be described later.

The DLL 200 synchronizes an output clock signal OUTCLK with the reference clock signal REFCLK. The DLL 200 supplies the output clock signal OUTCLK to each clock terminal of the flip-flops.

The flip-flop 135 captures and holds the bit signal B0 from the receiver 132 in synchronization with the output clock signal OUTCLK. The flip-flop 136 captures and holds the bit signal B1 from the receiver 133 in synchronization with the output clock signal OUTCLK.

Note that, although the DLL 200 is disposed in the imaging device 100, the DLL 200 may be disposed in an electronic device other than the imaging device 100. Furthermore, the imaging device 100 is an example of an electronic device described in the claims.

(Configuration Example of DLL)

Figure 3:
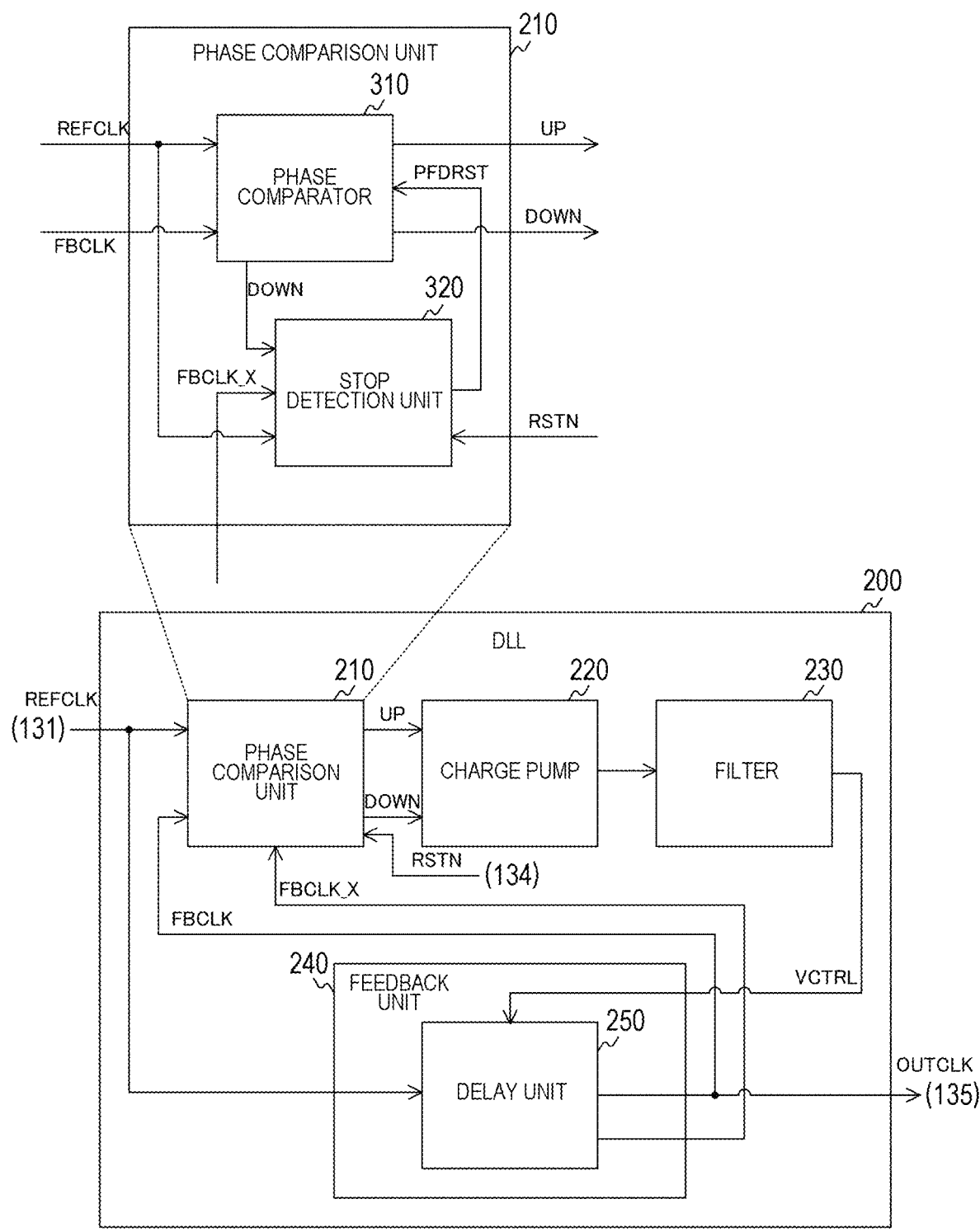
FIG. 3 is a block diagram illustrating a configuration example of a DLL according to the first embodiment of the present technology.

FIG. 3 is a block diagram illustrating a configuration example of the DLL 200 according to the first embodiment of the present technology. The DLL 200 includes a phase comparison unit 210, a charge pump 220, a filter 230, and a feedback unit 240. Note that the DLL 200 is an example of a semiconductor integrated circuit described in the claims.

The phase comparison unit 210 includes a phase comparator 310 and a stop detection unit 320. The phase comparator 310 compares a phase of the input reference clock signal REFCLK with a phase of a feedback clock signal FBCLK. The phase comparator 310 supplies a comparison result including control signals UP and DOWN to the charge pump 220.

The stop detection unit 320 detects whether or not the reference clock signal REFCLK is stopped, and initializes a comparison result (the control signals UP and DOWN) in a case where the reference clock signal REFCLK is stopped.

The charge pump 220 generates a control voltage VCTRL for control of a frequency of the feedback clock signal FBCLK, on the basis of the control signals UP and DOWN. The control voltage VCTRL is supplied to the feedback unit 240 via the filter 230. For example, a loop filter is used as the filter 230.

The feedback unit 240 generates the feedback clock signal FBCLK in accordance with the control voltage VCTRL. The feedback unit 240 includes a delay unit 250. The delay unit 250 delays the reference clock signal REFCLK over a delay time according to the control voltage VCTRL, and outputs as the feedback clock signal FBCLK to the phase comparator 310. Furthermore, the delay unit 250 supplies a feedback clock signal FBCLK_X having a delay time different from that of the feedback clock signal FBCLK, to the stop detection unit 320. Furthermore, the feedback clock signal FBCLK is output as the output clock signal OUTCLK to the flip-flop 135 and the like.

Figure 4:
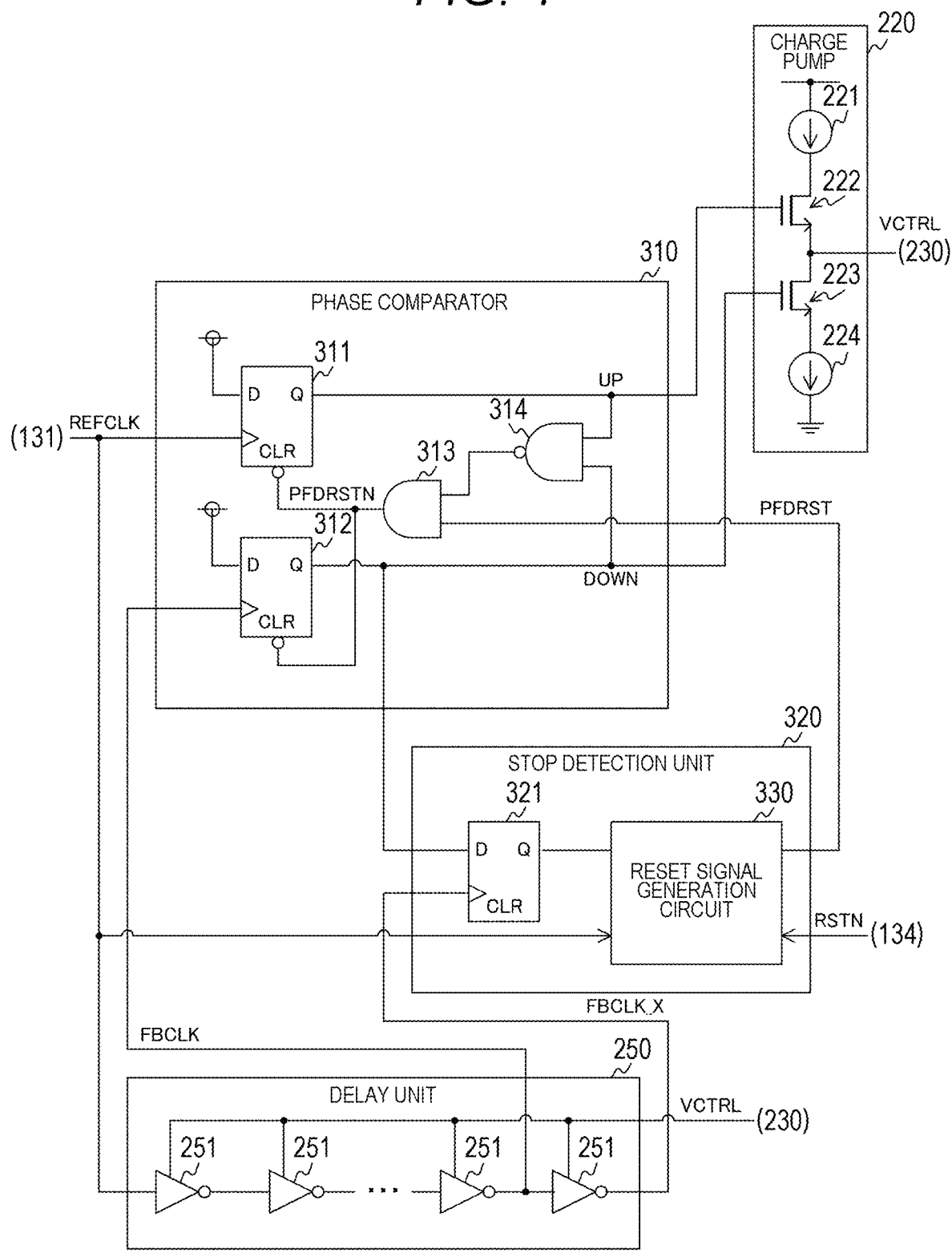
FIG. 4 is a circuit diagram illustrating a configuration example of a phase comparator, a charge pump, a stop detection unit, and a delay unit according to the first embodiment of the present technology.

FIG. 4 is a circuit diagram illustrating a configuration example of the phase comparator 310, the charge pump 220, the stop detection unit 320, and the delay unit 250 according to the first embodiment of the present technology. The phase comparator 310 includes flip-flops 311 and 312, an AND (logical product) gate 313, and a NAND (negative logical product) gate 314.

The flip-flop 311 captures and holds a high level in synchronization with the reference clock signal REFCLK, and supplies the high level to the charge pump 220 as the control signal UP. The flip-flop 312 captures and holds a high level in synchronization with the feedback clock signal FBCLK, and supplies the high level as the control signal DOWN to the charge pump 220 and the stop detection unit 320. Furthermore, clear terminals of the flip-flops 311 and 312 are non-inverting-input terminals, and a control signal PFDRSTN is input to the clear terminals.

The NAND gate 314 supplies a negative logical product of the control signals UP and DOWN to the AND gate 313. The AND gate 313 supplies a logical product of a signal from the NAND gate 314 and a reset signal PFDRST to the flip-flops 311 and 312, as the control signal PFDRSTN.

The circuit configuration illustrated in the figure causes generation of the control signals UP and DOWN according to a phase difference between the reference clock signal REFCLK and the feedback clock signal FBCLK. Furthermore, when a low-level reset signal PFDRST is input, the control signals UP and DOWN are initialized to become a low level.

The charge pump 220 includes current sources 221 and 224 and n-channel metal oxide semiconductor (nMOS) transistors 222 and 223. The current source 221 is connected to a power supply terminal, and the current source 224 is connected to a ground terminal. The nMOS transistors 222 and 223 are inserted in series between the current source 221 and the current source 224. The control signal UP is input to a gate of the nMOS transistor 222, and the control signal DOWN is input to a gate of the nMOS transistor 223. Furthermore, a voltage at a connection node between the nMOS transistors 222 and 223 is supplied to the filter 230 as the control voltage VCTRL.

According to the circuit configuration illustrated in the figure, when the control signal UP is a high level and the control signal DOWN is a low level, the filter 230 is charged and the control voltage VCTRL increases. Whereas, when the control signal UP is a low level and the control signal DOWN is a high level, the filter 230 is discharged and the control voltage VCTRL decreases.

The stop detection unit 320 includes a flip-flop 321 and a reset signal generation circuit 330. The flip-flop 321 captures and holds the control signal DOWN in synchronization with the feedback clock signal FBCLK_X. The flip-flop 321 supplies a held control signal DOWN to the reset signal generation circuit 330. Note that the flip-flop 321 is an example of a pre-stage flip-flop described in the claims.

The reset signal generation circuit 330 detects whether or not the reference clock signal REFCLK is stopped on the basis of the control signal from the flip-flop 321 and the reference clock signal REFCLK, and generates a low-level reset signal PFDRST when the reference clock signal REFCLK is stopped.

Normally, in the DLL 200, when the reference clock signal REFCLK is stopped, the output clock signal OUTCLK (that is, the feedback clock signal FBCLK) is also stopped, and thus it is difficult to control the circuit after the stop. By providing the stop detection unit 320 described above, such difficulty can be solved.

The delay unit 250 includes a predetermined stage number of delay elements 251 (in other words, delay lines) to which the reference clock signal REFCLK is input in the first stage. A delay time of each of these delay elements 251 becomes longer as the control voltage VCTRL is lower. For example, an inverter is used as the delay element 251. Furthermore, with a predetermined odd number defined as K, the delay element 251 of a K-th stage supplies a delayed signal to the phase comparator 310 as the feedback clock signal FBCLK. Furthermore, the delay element 251 at a position (such as a (K+1) th stage) different from the K-th stage supplies a signal to the stop detection unit 320 as the feedback clock signal FBCLK_X.

Figure 5:
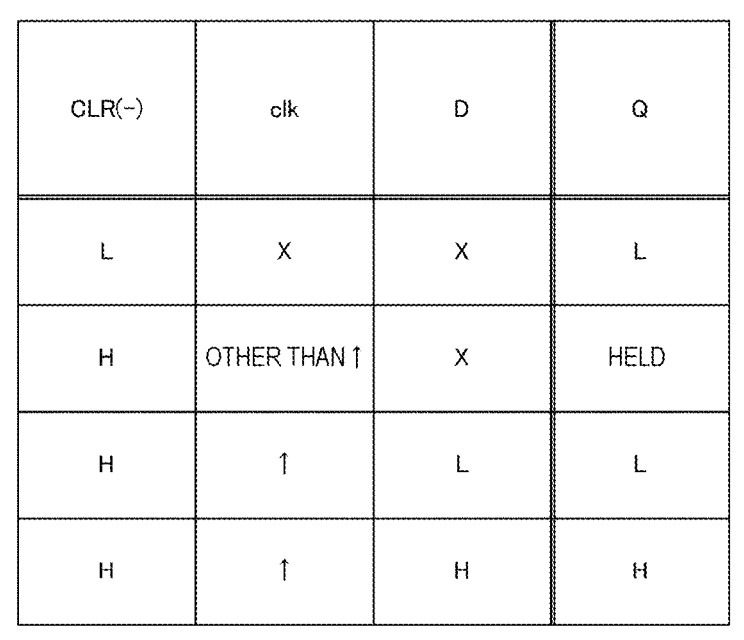

FIG. 5 is a view illustrating an example of an operation of the flip-flop 311 according to the first embodiment of the present technology. The flip-flop 311 includes a clear terminal CLR, a clock terminal clk, a data input terminal D, and an output terminal Q. In the figure, "H" indicates a high level, and "L" indicates a low level. Furthermore, "↑" indicates rising of a signal.

When a low level is input to the inverting-input clear terminal CLR, the low level is output from the output terminal Q regardless of values of the clock terminal clk and the data input terminal D. When a high level is input to the clear terminal CLR, and a state of the clock terminal clk is other than rising, the flip-flop 311 is in a holding state and a held value is output from the output terminal Q. Furthermore, when a high level is input to the clear terminal CLR, and a state of the clock terminal clk is rising, the flip-flop 311 is in a through state, and a value of the data input terminal D is output as it is from the output terminal Q.

Note that a circuit configuration of flip-flops (the flip-flop 312 and the like) other than the flip-flop 311 is similar to that of the flip-flop 311.

(Configuration Example of Stop Detection Unit)

Figure 6:
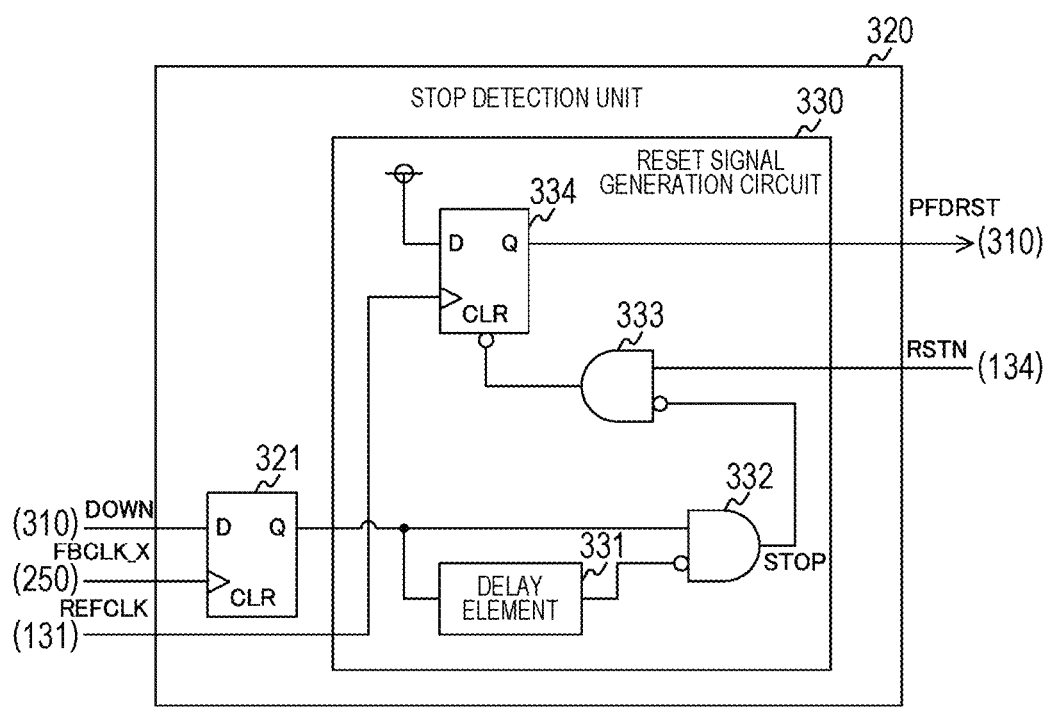
FIG. 6 is a circuit diagram illustrating a configuration example of the stop detection unit according to the first embodiment of the present technology.

FIG. 6 is a circuit diagram illustrating a configuration example of the stop detection unit 320 according to the first embodiment of the present technology. The reset signal generation circuit 330 includes a delay element 331, logic gates 332 and 333, and a flip-flop 334.

The delay element 331 delays the control signal DOWN from the flip-flop 321. For example, an inverter is used as the delay element 331. The logic gate 332 outputs a logical product of an inverted value of the signal delayed by the delay element 331 and the control signal DOWN from the flip-flop 321, as a detection signal STOP. Note that the logic gate 332 is an example of a post-stage logic gate described in the claims.

The logic gate 333 outputs a logical product of an inverted value of the detection signal STOP and the control signal RSTN, to an inverting-input clear terminal of the flip-flop 334.

The flip-flop 334 captures and holds a high level in synchronization with the reference clock signal CLK. The flip-flop 334 outputs a held value as the reset signal PFDRST, to the phase comparator 310. Note that the flip-flop 334 is an example of a post-stage flip-flop described in the claims.

The circuit configuration illustrated in the figure causes generation of a high-level detection signal STOP over a predetermined pulse period when the reference clock signal REFCLK is stopped.

Furthermore, when the control signal RSTN is a high level, an inverted value of the detection signal STOP is output from the logic gate 333, and a low-level reset signal PFDRST is output from an inverter 335 until next rising of the reference clock signal REFCLK. Whereas, when the control signal RSTN is a low level, a low level is output from the logic gate 333, and a high-level reset signal PFDRST is output from the inverter 335 regardless of the detection signal STOP. In this way, the detection operation of the stop detection unit 320 can be enabled or disabled by the control signal RSTN.

Note that, in a case where it is not necessary to control the detection operation of the stop detection unit 320 to be enabled or disabled, the logic gate 333 can be reduced. In this case, the detection signal STOP is output as it is to the flip-flop 334.

Figure 7:
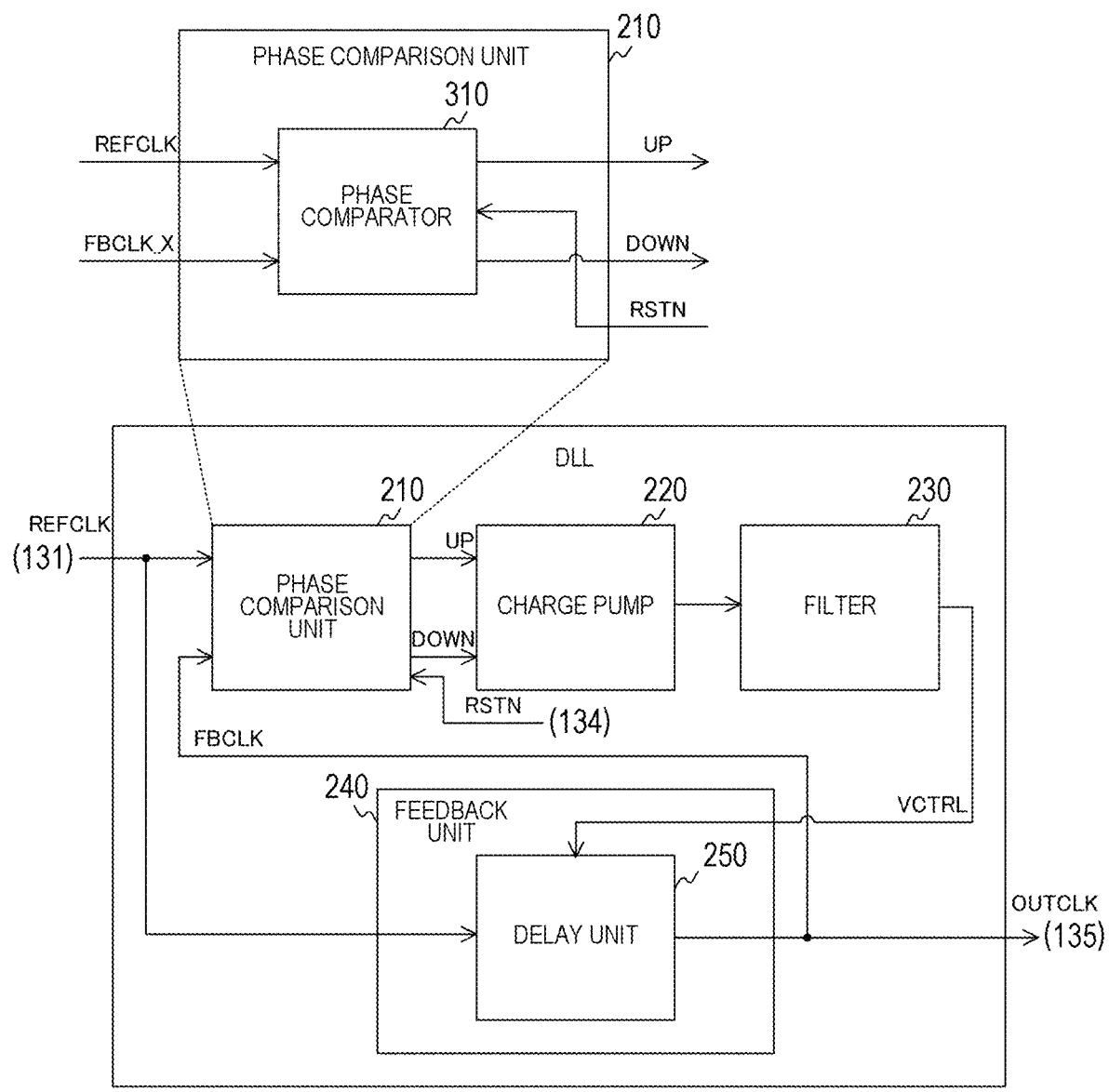
FIG. 7 is a block diagram illustrating a configuration example of a DLL according to a comparative example.

Here, as illustrated in FIG. 7, a DLL without the stop detection unit 320 is assumed as a comparative example. In this comparative example, the control signal RSTN is input to the phase comparator 310 instead of the reset signal PFDRST. Furthermore, the feedback clock signal FBCLK_X is not output from the delay unit 250.

Figure 8:
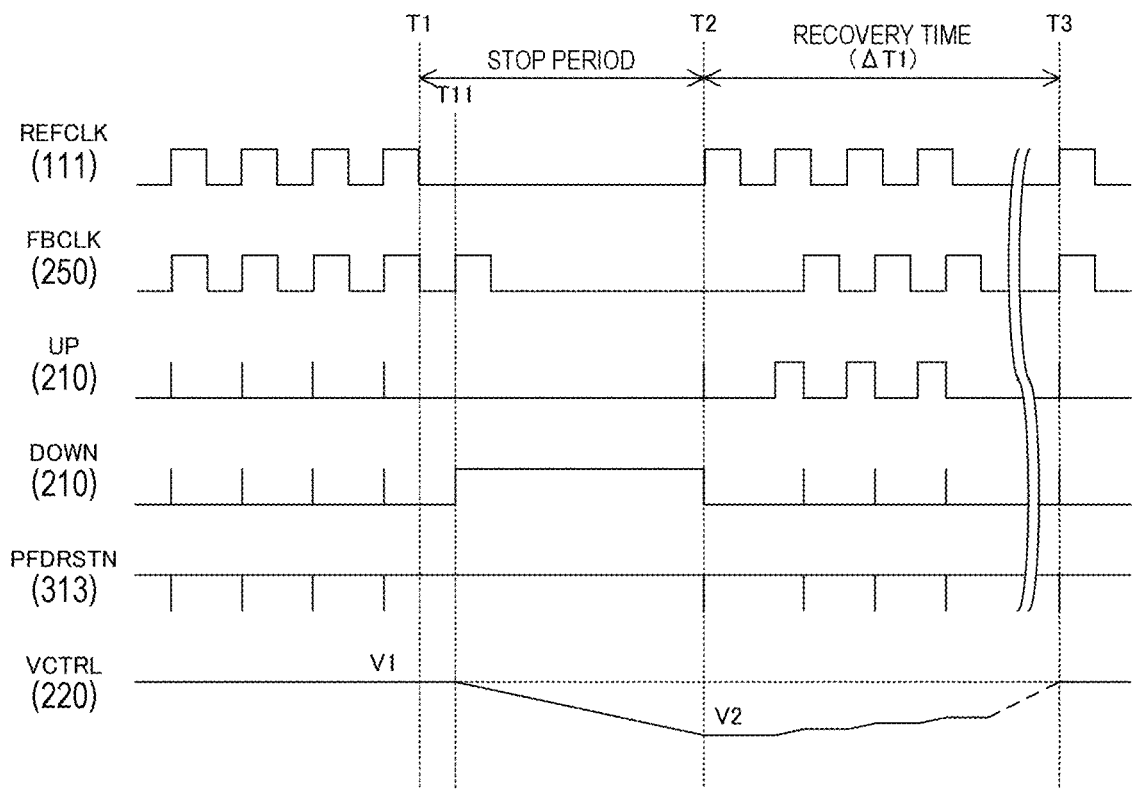
FIG. 8 is a timing chart illustrating an example of an operation of the DLL according to the comparative example.

FIG. 8 is a timing chart illustrating an example of an operation of the DLL according to the comparative example. It is assumed that, before a timing T1, there is no phase difference between the feedback clock signal FBCLK and the reference clock signal REFCLK, and the feedback clock signal FBCLK and the reference clock signal REFCLK are synchronized with each other. In this case, the control signals UP and DOWN are generated with short pulses in synchronization with the clock signal, but pulse widths thereof are short and the pulses are generated simultaneously, so that the control voltage VCTRL does not fluctuate.

It is assumed that the transmission circuit 111 stops the supply of the reference clock signal REFCLK during a stop period from the timing T1 to a timing T2. For example, in an HS-IDLE mode in the MIPI, the reference clock signal REFCLK is stopped. After the reference clock signal REFCLK is stopped, the feedback clock signal FBCLK is also stopped with a delay of one clock.

At a rising timing T11 immediately before the stop of the feedback clock signal FBCLK, the phase comparison unit 210 outputs a high-level control signal DOWN in accordance with a phase difference between the feedback clock signal FBCLK and the reference clock signal REFCLK. In the comparative example, since the phase comparison unit 210 is not initialized, the high-level control signal DOWN is continuously output over a period from the timing T11 to the timing T2.

Due to the high-level control signal DOWN, the control voltage VCTRL continues to decrease over a period from the timing T11 to the timing T2. A level of the control voltage VCTRL at the timing T11 is defined as V1, and a level of the control voltage VCTRL at the timing T2 is defined as V2.

At the timing T2, the transmission circuit 111 resumes transmission of the reference clock signal REFCLK, and also resumes transmission of the feedback clock signal FBCLK with a delay. In accordance with the phase difference between the feedback clock signal FBCLK and the reference clock signal REFCLK, the phase comparison unit 210 outputs a high-level control signal UP, and the control voltage VCTRL is gradually increased by the control signal UP.

Then, at a timing T3, the control voltage VCTRL becomes V1 that is of immediately before the stop, and the feedback clock signal FBCLK is synchronized with the reference clock signal REFCLK again. A time from the timing T2 at which the stop period has elapsed to the timing T3 at which the feedback clock signal FBCLK is synchronized is defined as a recovery time ΔT1. The recovery time ΔT1 is also referred to as a lock time.

As illustrated in the figure, in the comparative example, the control voltage VCTRL continues to decrease until the elapse of the stop period. Therefore, as the stop period is longer, a fluctuation amount of the control voltage VCTRL increases, and it takes time for the control voltage VCTRL to return to a level that is of immediately before the stop after the elapse of the stop period. That is, as the stop period is longer, the recovery time ΔT1 (lock time) becomes longer.

(Operation Example of DLL)

Figure 9:
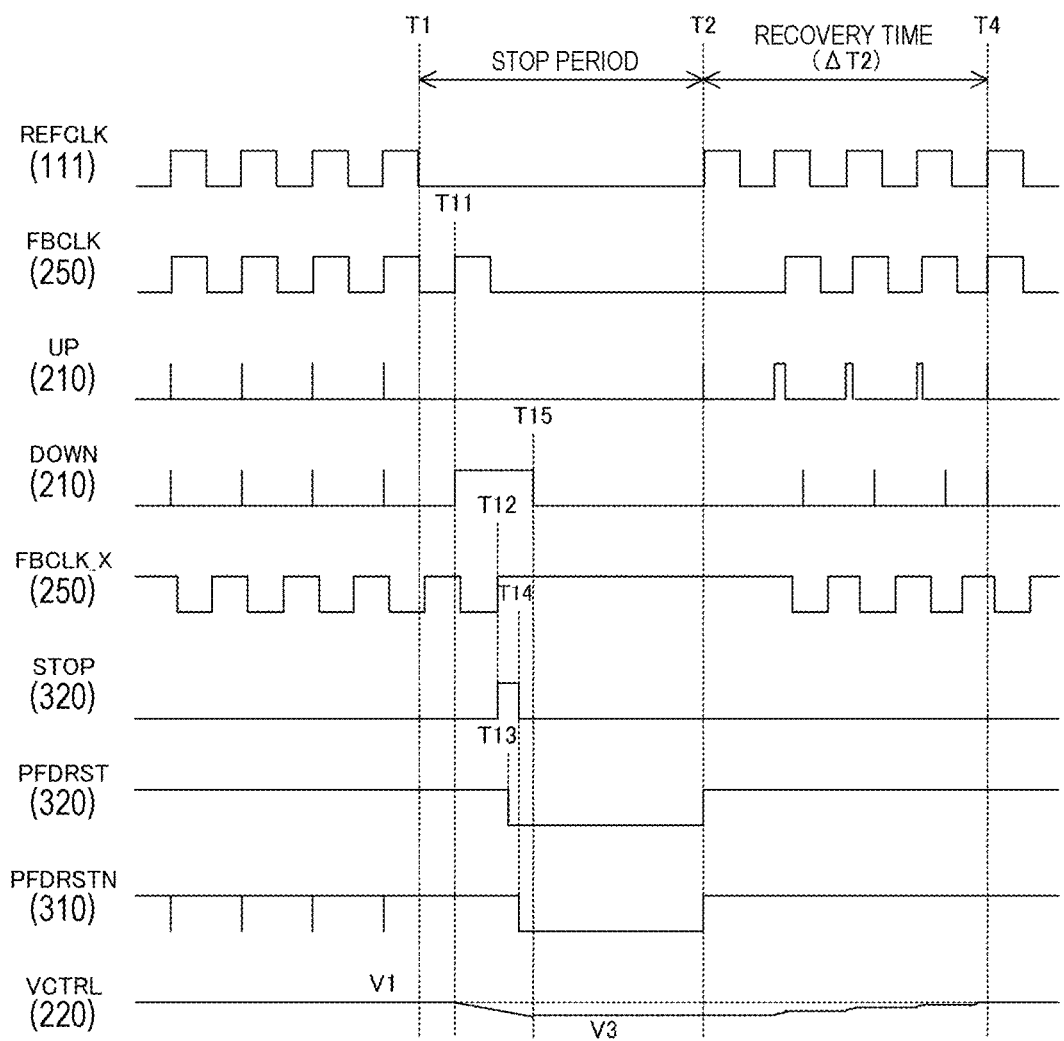
FIG. 9 is a timing chart illustrating an example of an operation of the DLL according to the first embodiment of the present technology.

FIG. 9 is a timing chart illustrating an example of an operation of the DLL 200 according to the first embodiment of the present technology. During the stop period, the stop detection unit 320 captures the control signal DOWN at a rising timing T12 of the feedback clock signal FBCLK_X, and internally generates a high-level detection signal STOP. Then, the stop detection unit 320 generates a low-level reset signal PFDRST at a timing T13 immediately thereafter.

In accordance with the low-level reset signal PFDRST, the phase comparator 310 in the phase comparison unit 210 sets the control signal PFDRSTN to a low level at a timing T14, and the stop detection unit 320 sets the detection signal STOP to a low level. At a timing T15 immediately thereafter, the phase comparator 310 initializes the control signal DOWN to a low level.

Since the control signal DOWN is initialized at the timing T15 before the end of the stop period, decrease of the control voltage VCTRL stops at the timing T15. A level V3 of the control voltage VCTRL at the timing T15 is higher value than the level V2 at the end of the stop period of the comparative example.

At the timing T2, the transmission circuit 111 resumes transmission of the reference clock signal REFCLK, and the phase comparator 310 sets the control signal RFDRSTN to a high level.

In a case where the stop detection unit 320 is provided, a time from the timing T2 to a timing T4 at which the feedback clock signal FBCLK is synchronized is defined as a recovery time ΔT2. In the case where the stop detection unit 320 is provided, as described above, a fluctuation amount of the control voltage VCTRL is smaller than that in the comparative example. Therefore, the control voltage VCTRL increases to the level V1 that is of immediately before the stop in a time shorter than that in the comparative example, and the recovery time ΔT2 (lock time) is shorter than the recovery time ΔT1 in the comparative example.

Note that, although the phase comparator 310 that outputs the control signal DOWN during the stop period is used, the phase comparator 310 that outputs the control signal UP may also be used instead. In this case, the control signal UP is input to the stop detection unit 320 instead of the control signal DOWN.

Figure 10:
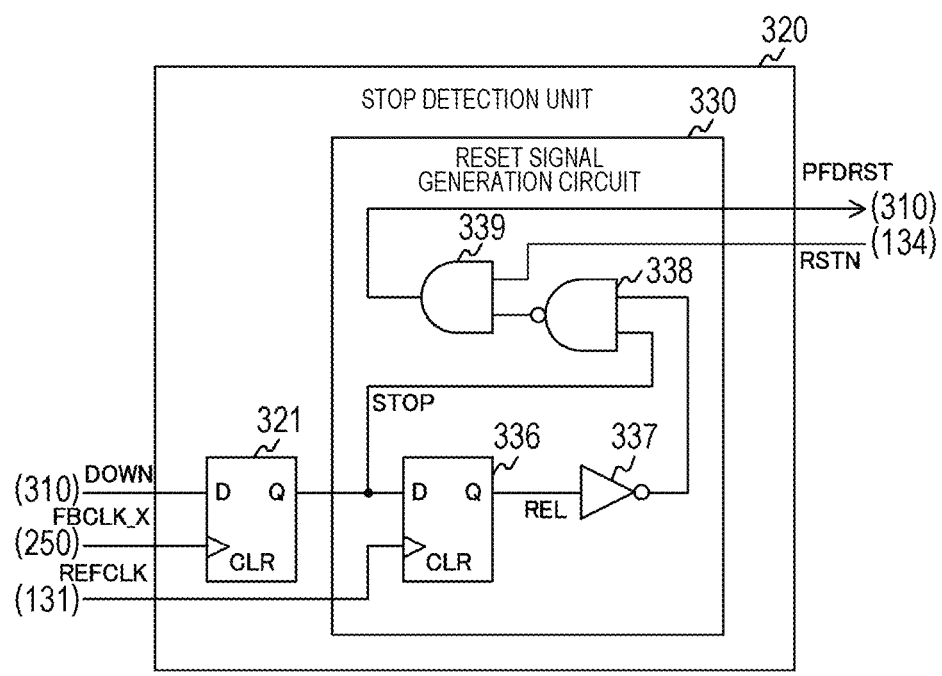
FIG. 10 is a circuit diagram illustrating another example of the stop detection unit according to the first embodiment of the present technology.

Furthermore, as illustrated in FIG. 10, a flip-flop 336, an inverter 337, a NAND gate 338, and an AND gate 339 can be disposed in the reset signal generation circuit 330. In this case, the flip-flop 321 outputs a held signal as the detection signal STOP.

The flip-flop 336 captures and holds the detection signal STOP from the flip-flop 321 in synchronization with the reference clock signal REFCLK. The flip-flop 336 outputs a held signal as an internal signal REL. The inverter 337 inverts the internal signal REL from the flip-flop 336, and outputs the signal as an inverted signal to the NAND gate 338. The NAND gate 338 outputs a negative logical product of the inverted signal and the detection signal STOP to the AND gate 339. The AND gate 339 outputs a logical product of the output signal of the NAND gate 338 and the control signal RSTN to the phase comparator 310, as a reset signal RFDRST.

Note that the flip-flop 336 is an example of a post-stage flip-flop described in the claims. The circuit including the NAND gate 338 and the AND gate 339 is an example of a post-stage logic circuit described in the claims.

Figure 11:
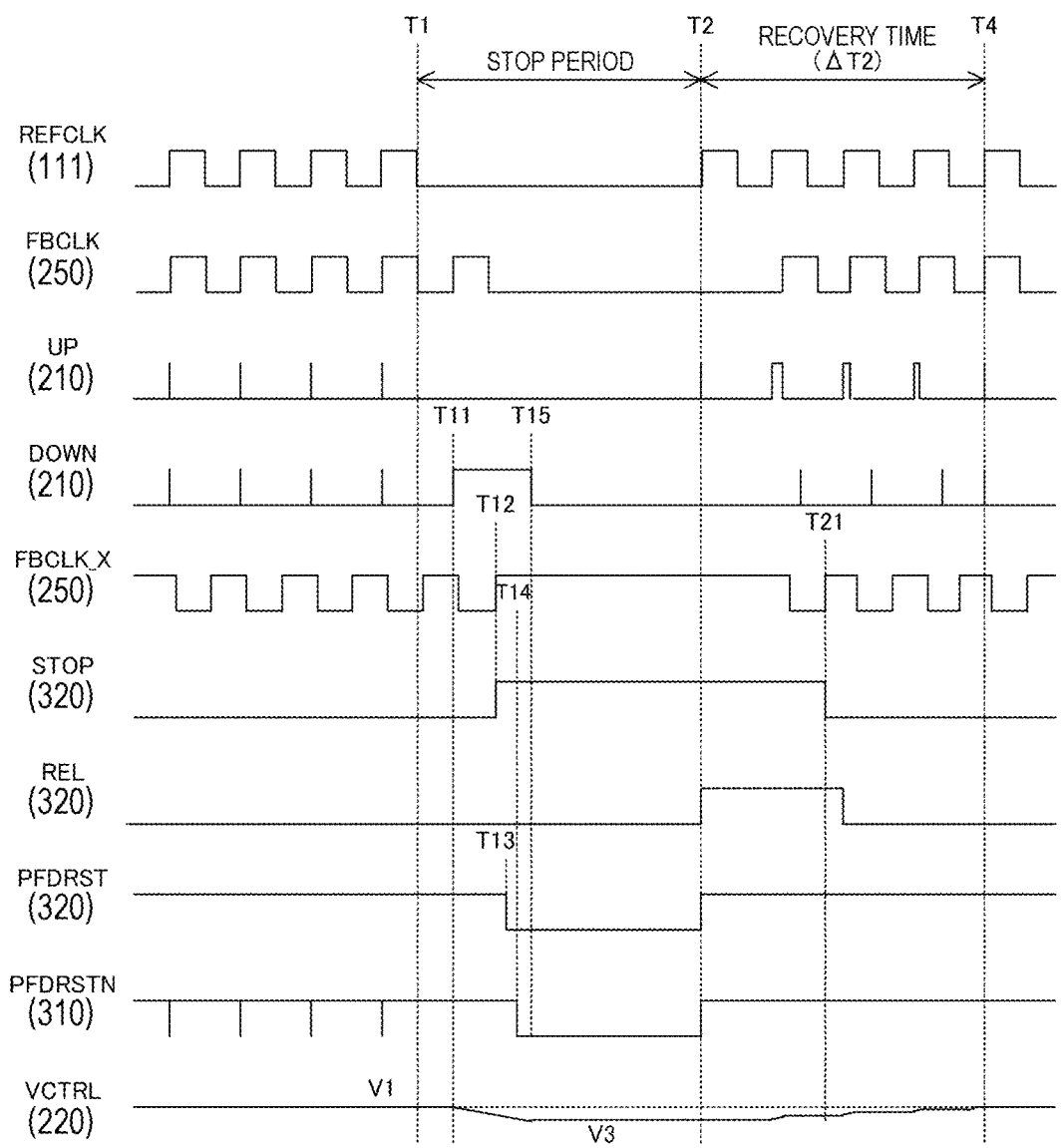
FIG. 11 is a timing chart illustrating another example of an operation of the DLL provided with the stop detection unit in FIG. 10, according to the first embodiment of the present technology.

FIG. 11 is a timing chart illustrating another example of an operation of the DLL 200 provided with the stop detection unit 320 in FIG. 10, according to the first embodiment of the present technology. During the stop period, the stop detection unit 320 internally generates a high-level detection signal STOP, at the rising timing T12 of the feedback clock signal FBCLK_X. However, the detection signal STOP does not become a low level at the timing T14, but remains as the high level.

At the timing T2, the stop detection unit 320 generates a high-level internal signal REL. Then, at a rising timing T21 of the feedback clock signal FBCLK_X, the stop detection unit 320 sets the detection signal STOP to a low level, and sets the internal signal REL to a low level immediately thereafter.

Furthermore, the DLL 200 has been disposed in the reception device 120 outside the solid-state imaging element 110, but the DLL 200 can also be disposed in the solid-state imaging element 110.

Figure 12:
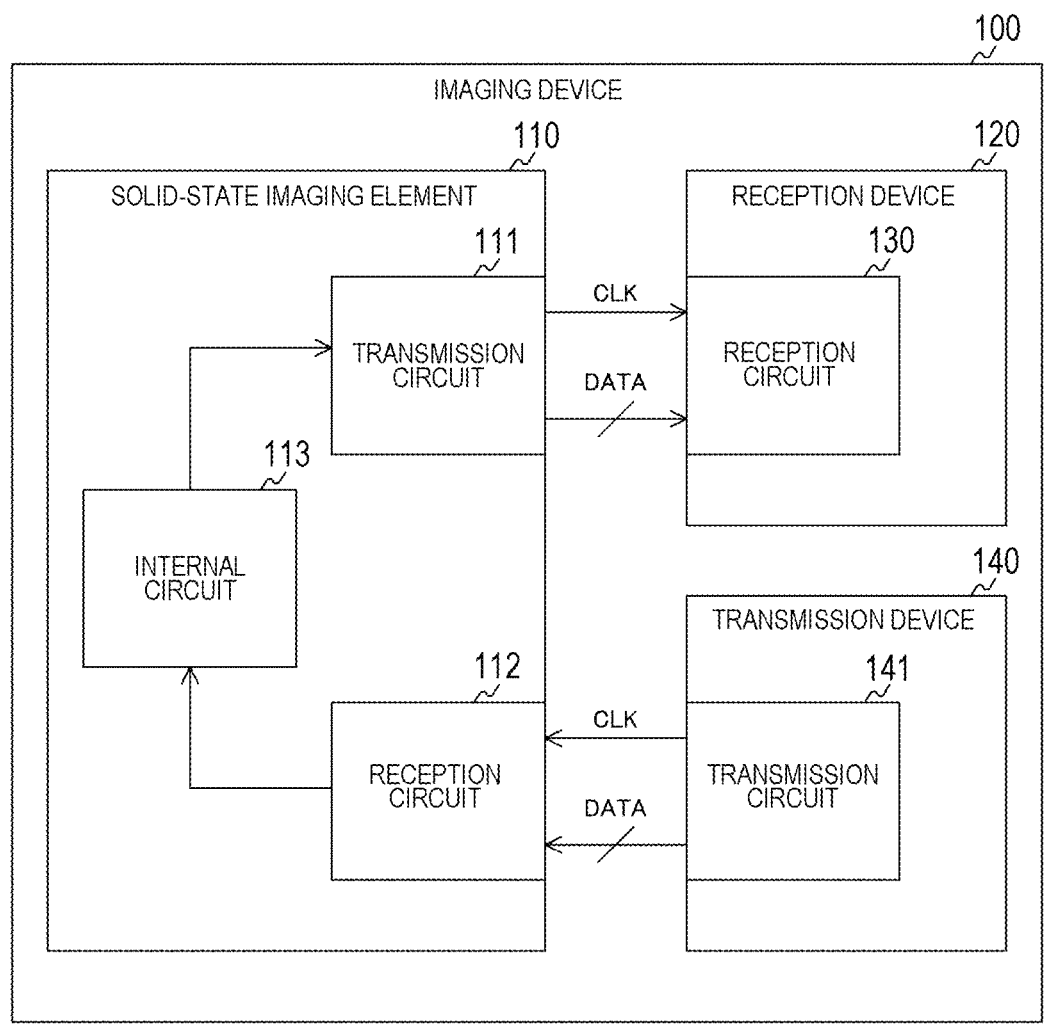
FIG. 12 is a block diagram illustrating a configuration example of the imaging device in which the DLL is disposed in a solid-state imaging element, according to the first embodiment of the present technology.

FIG. 12 is a block diagram illustrating a configuration example of the imaging device 100 in which the DLL 200 is disposed in the solid-state imaging element 110, according to the first embodiment of the present technology. In the figure, the imaging device 100 further includes a transmission device 140 provided with a transmission circuit 141. Furthermore, the solid-state imaging element 110 further includes a reception circuit 112 and an internal circuit 113.

The reception circuit 112 receives the clock signal CLK and the data signal DATA from the transmission circuit 141. The DLL 200 is disposed in this reception circuit 112. The reception circuit 112 supplies the received data to the internal circuit 113. The internal circuit 113 performs predetermined processing on the basis of the received data, generates image data and the like, and supplies the image data and the like to the transmission circuit 111.

In this way, according to the first embodiment of the present technology, since the stop detection unit 320 initializes the control signal DOWN when the reference clock signal REFCLK is stopped, a fluctuation amount of the control voltage VCTRL during the stop period can be reduced. As a result, the recovery time (lock time) can be shortened as compared with a case where the stop detection unit 320 is not disposed.

2. Second Embodiment

In the first embodiment described above, the stop detection unit 320 has held the control signal DOWN in the flip-flop 321, and detected stop of the reference clock signal REFCLK on the basis of the signal. However, since the control signal DOWN is generated even at the time of activation, there is a possibility that the stop detection unit 320 erroneously detects stop of the reference clock signal REFCLK even though the reference clock signal REFCLK is not stopped. A DLL 200 of this second embodiment is different from that of the first embodiment in that a control signal DOWN is input to a flip-flop 321 when a predetermined period at the time of activation has elapsed.

Figure 13:
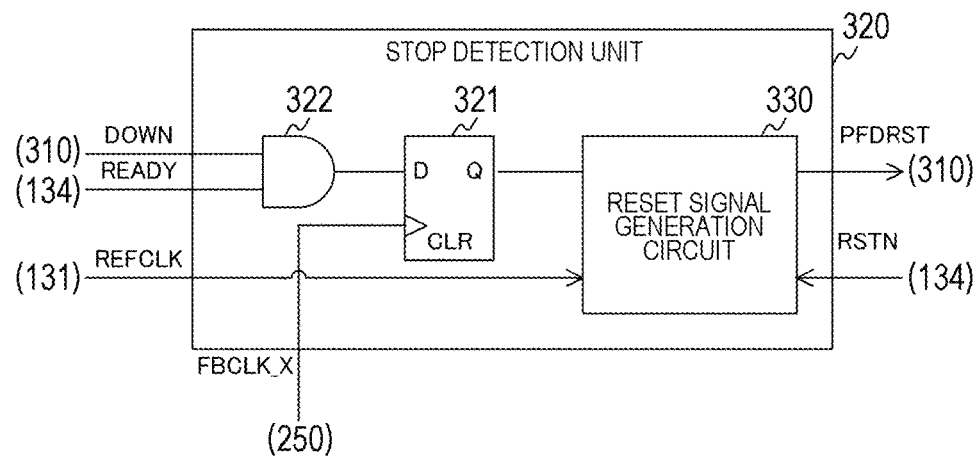
FIG. 13 is a circuit diagram illustrating a configuration example of a stop detection unit according to a second embodiment of the present technology.

FIG. 13 is a circuit diagram illustrating a configuration example of a stop detection unit 320 according to the second embodiment of the present technology. The stop detection unit 320 of the second embodiment is different from that of the first embodiment in further including an AND gate 322. A circuit configuration of a reset signal generation circuit 330 of the second embodiment is similar to that of the first embodiment, and the circuit illustrated in FIG. 6 or 10 is used.

The AND gate 322 outputs a logical product of a control signal READY from a control unit 134 and a control signal DOWN, to an input terminal of the flip-flop 321. The control signal READY is set with a low level over the period at the time of activation from a time when a control voltage VCTRL is an initial value to at least a time when a feedback clock signal FBCLK is synchronized, and the control signal READY is set with a high level after elapse of the period. The AND gate 322 inputs the control signal DOWN to the flip-flop 321 when the period at the time of activation has elapsed.

Note that the AND gate 322 is an example of a pre-stage logic gate described in the claims.

Figure 14:
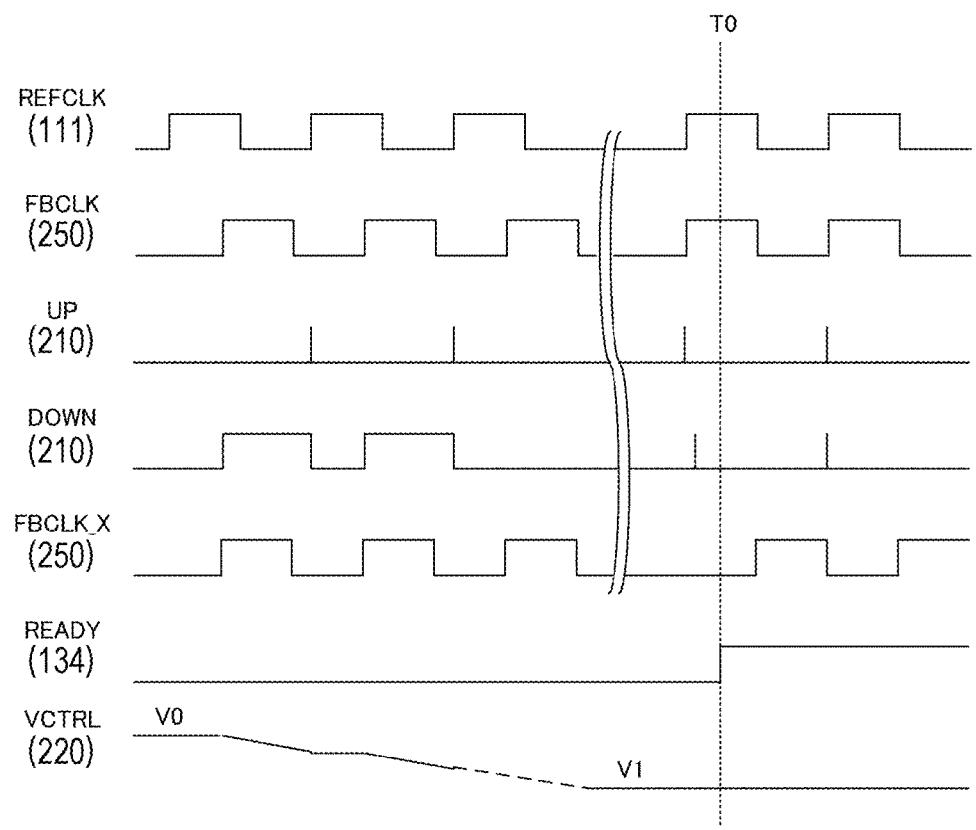
FIG. 14 is a timing chart illustrating an example of an operation of a DLL according to the second embodiment of the present technology.

FIG. 14 is a timing chart illustrating an example of an operation of the DLL 200 according to the second embodiment of the present technology. The control voltage VCTRL is V0 in an initial state. This V0 is assumed to be the highest within a voltage range set to the control voltage VCTRL. Therefore, the DLL 200 starts the operation from a state in which a delay time of a delay unit 250 is the shortest.

During a period up to a timing T0 immediately after synchronization of the feedback clock signal FBCLK, a phase comparator 310 generates a high-level control signal DOWN in accordance with a phase difference, and the control voltage VCTRL gradually decreases in response to the control signal DOWN. At the timing T0, the control voltage VCTRL becomes a level V1 lower than the initial level V0. When the stop detection unit 320 erroneously detects stop of a reference clock signal REFCLK within the period at the time of activation, the control signal DOWN is initialized, and the synchronization operation is impaired.

Therefore, the control unit 134 sets the control signal READY to a low level over the period up to the timing T0, and to the high level after the timing T0. A logic gate 333 inputs the control signal DOWN to the flip-flop 321 after the timing T0. As a result, erroneous detection of stop within the period at the time of activation is prevented.

In this way, according to the second embodiment of the present technology, since the AND gate 322 inputs the control signal DOWN to the flip-flop 321 when the period at the time of activation has elapsed, it is possible to prevent erroneous detection of stop.

3. Third Embodiment

In the second embodiment described above, the delay unit 250 has supplied a signal having a delay time different from that of the feedback clock signal FBCLK to the stop detection unit 320 as the feedback clock signal FBCLK_X. However, the delay time of the feedback clock signal FBCLK_X is desirably set in accordance with signal quality of the reference clock signal REFCLK. A DLL 200 of this third embodiment is different from that of the second embodiment in that a feedback unit 240 selects any of a plurality of clock signals having different delay times and outputs the clock signal as a feedback clock signal FBCLK_X.

Figure 15:
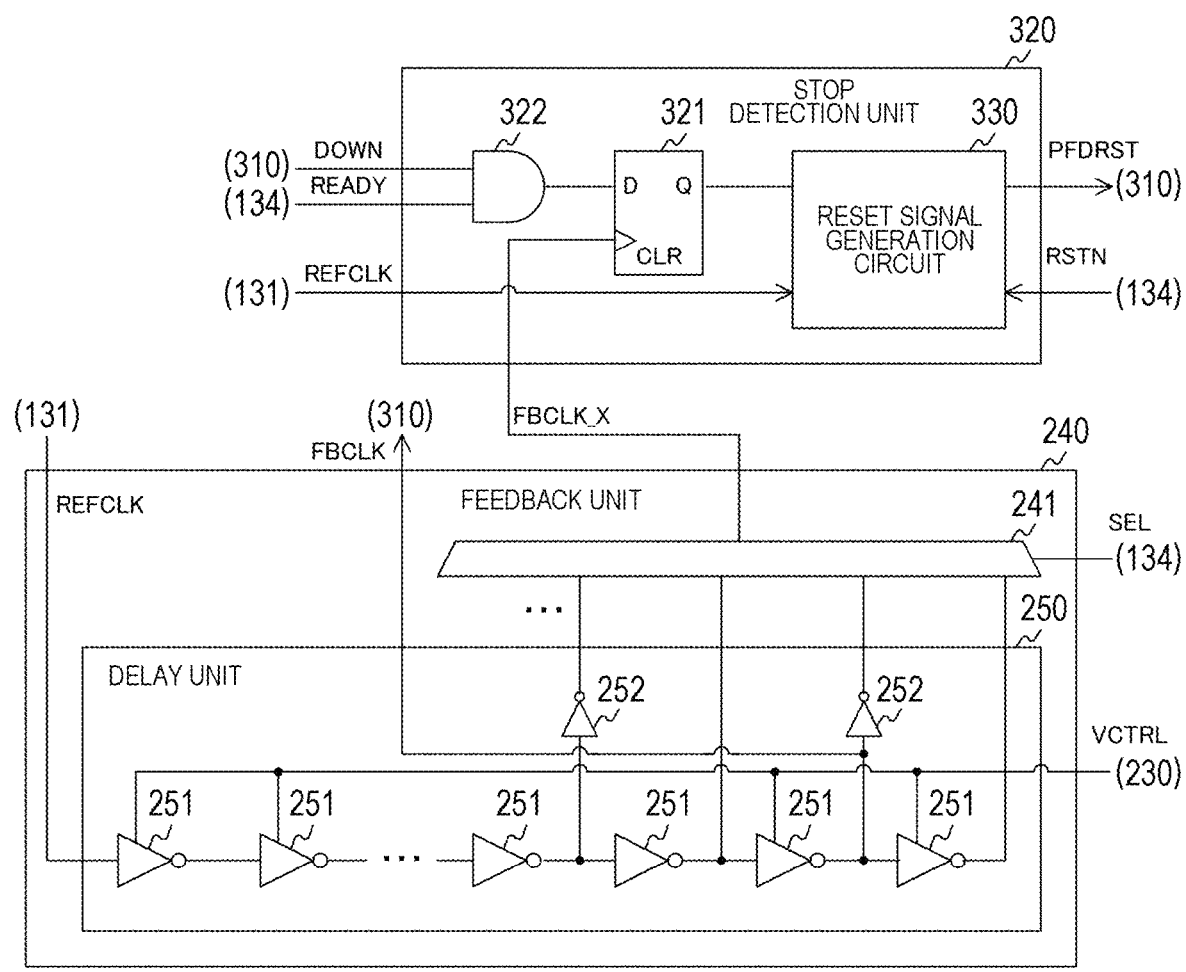
FIG. 15 is a circuit diagram illustrating a configuration example of a stop detection unit and a feedback unit according to a third embodiment of the present technology.

FIG. 15 is a circuit diagram illustrating a configuration example of a stop detection unit 320 and the feedback unit 240 according to the third embodiment of the present technology. The stop detection unit 320 according to the third embodiment is similar to that in the second embodiment. Note that the stop detection unit 320 of the first embodiment can also be applied to the third embodiment.

The feedback unit 240 of the third embodiment is different from that of the second embodiment in further including a multiplexer 241. Furthermore, a delay unit 250 of the third embodiment is different from that of the second embodiment in further including a predetermined number of delay elements 252. An inverter or the like is used as the delay element 252.

Delay elements 251 are provided for all or some of the delay elements 252 in odd-numbered stages. The delay elements 251 in the odd-numbered stages also output signals to the corresponding delay elements 252. The delay element 252 inverts a signal from the delay element 251 and supplies the signal to the multiplexer 241. Furthermore, all or some of the delay elements 251 in even-numbered stages also output signals to the multiplexer 241.

The multiplexer 241 selects any of a plurality of clock signals from the delay elements 251 and 252 in accordance with a selection signal SEL from a control unit 134. The multiplexer 241 supplies the selected signal to a flip-flop 321 as the feedback clock signal FBCLK_X. The selection signal SEL is set in advance before the operation of the DLL 200 is started, and is held in a register or the like in the control unit 134.

As illustrated in the figure, the feedback clock signal FBCLK_X may be output from any stage as long as the delay element 251 is in a stage having a delay time different from that of the feedback clock signal FBCLK. As the delay time is shortened, duration of a control signal DOWN during a stop period can be shortened. However, if the delay time is too short, the stop detection unit 320 may erroneously capture the control signal DOWN during a normal operation other than the stop period, and erroneously detect stop.

Therefore, it is desirable to set an appropriate delay time in accordance with signal quality of the reference clock signal REFCLK. For example, as the signal quality of the reference clock signal REFCLK is higher and jitter is smaller, a clock signal with a shorter delay time is selected. As a result, the duration of the control signal DOWN during the stop period can be shortened, and a recovery time can be shortened. Whereas, as the signal quality of the reference clock signal REFCLK is lower and the jitter is larger, a clock signal with a longer delay time is selected. As a result, even in a case where the signal quality of the reference clock signal REFCLK is low, erroneous detection can be prevented.

Figure 16:
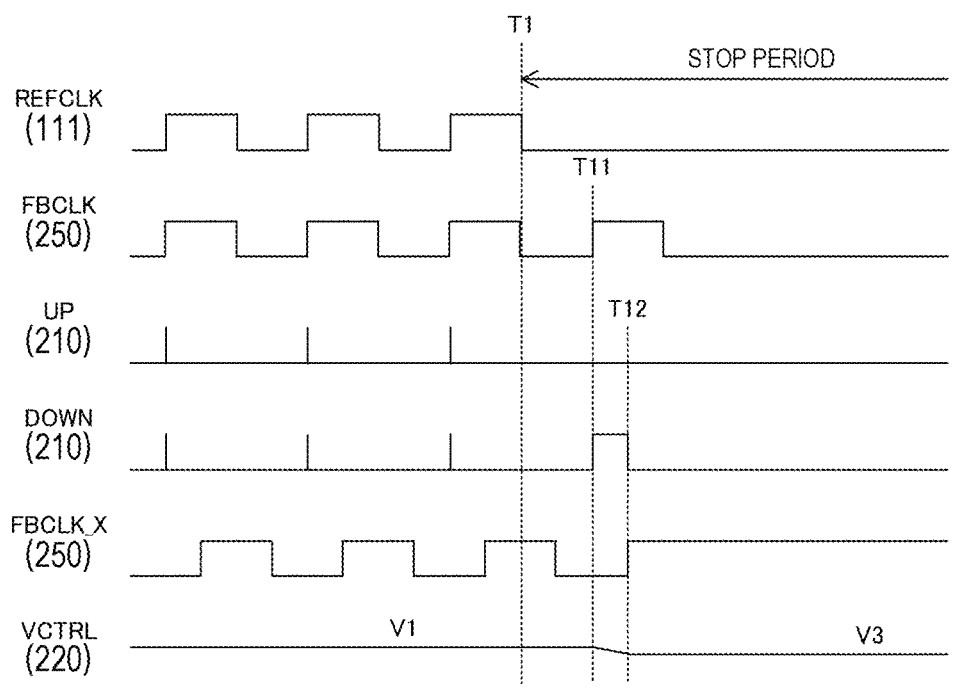
FIG. 16 is a timing chart illustrating another example of an operation of a DLL according to the third embodiment of the present technology.

FIG. 16 is a timing chart illustrating an example of an operation of the DLL 200 according to the second embodiment of the present technology. A delay time of the feedback clock signal FBCLK_X is assumed to be shorter than that of the second embodiment. In this case, the feedback clock signal FBCLK_X rises at a timing T12 immediately after a rising timing T11 of the feedback clock signal FBCLK during the stop period. The control signal DOWN is reset to a low level at the timing T12. As illustrated in the figure, since the delay time of the feedback clock signal FBCLK_X is short, a period in which the high-level control signal DOWN continues is shorter than that in the second embodiment.

In this way, according to the third embodiment of the present technology, the feedback unit 240 selects any of a plurality of clock signals having different delay times, and outputs the clock signal as the feedback clock signal FBCLK_X. Therefore, an appropriate delay time can be set in accordance with the signal quality of the reference clock signal REFCLK.

4. Fourth Embodiment

In the second embodiment described above, the stop detection unit 320 has been disposed in the DLL 200, but the stop detection unit 320 can also be applied to a PLL. This fourth embodiment is different from the second embodiment in that a stop detection unit 320 is applied to a PLL.

Figure 17:
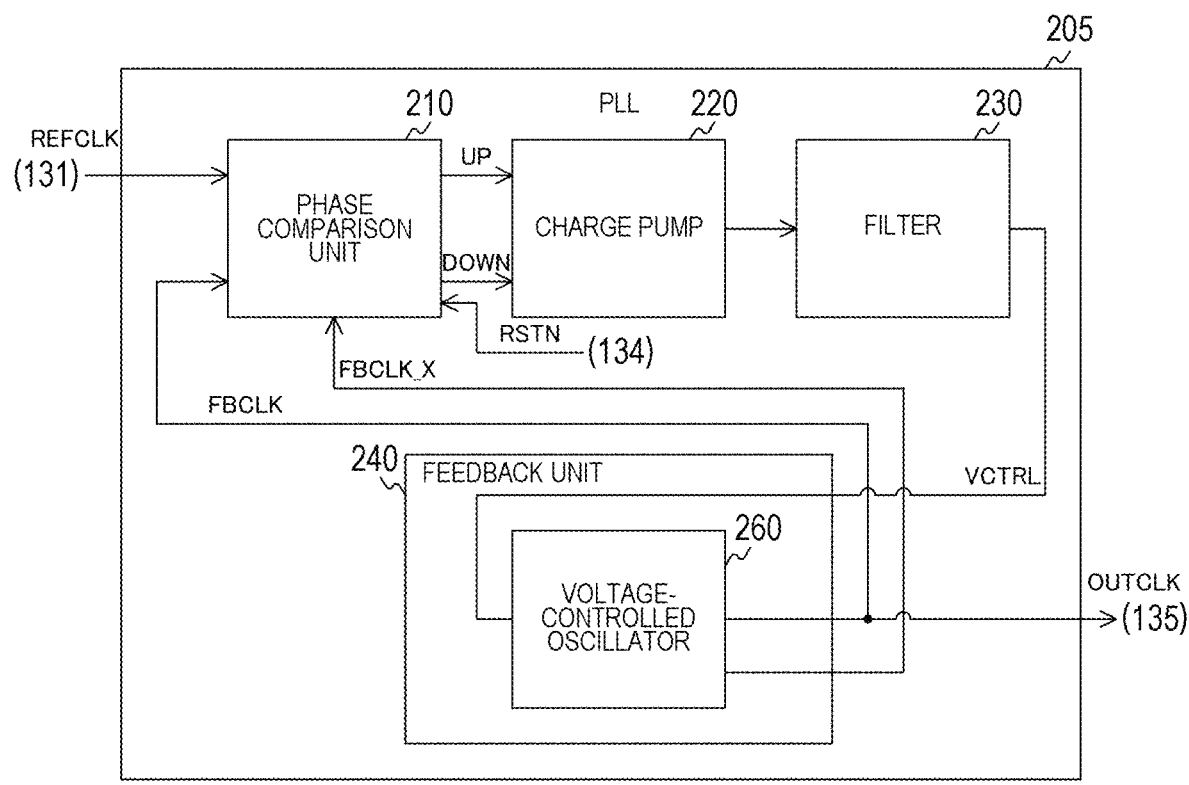
FIG. 17 is a block diagram illustrating a configuration example of a PLL according to a fourth embodiment of the present technology.

FIG. 17 is a block diagram illustrating a configuration example of a PLL 205 according to the fourth embodiment of the present technology. This PLL 205 is provided in a reception circuit 130 or the like. The PLL 205 includes a phase comparison unit 210, a charge pump 220, a filter 230, and a feedback unit 240. Note that the PLL 205 is an example of a semiconductor integrated circuit described in the claims.

Configurations of the phase comparison unit 210, the charge pump 220, and the filter 230 of the fourth embodiment are similar to those of the second embodiment, and the stop detection unit 320 is disposed in the phase comparison unit 210. In the feedback unit 240 of the fourth embodiment, a voltage-controlled oscillator 260 is disposed. Note that the stop detection unit 320 of the first embodiment can also be applied to the fourth embodiment.

The voltage-controlled oscillator 260 generates a feedback clock signal FBCLK having a frequency according to a control voltage VCTRL, and supplies the feedback clock signal FBCLK to the phase comparison unit 210. Furthermore, the voltage-controlled oscillator 260 generates a feedback clock signal FBCLK_X having a phase different from that of the feedback clock signal FBCLK together with the feedback clock signal FBCLK, and supplies the feedback clock signal FBCLK to the phase comparison unit 210. Furthermore, the feedback clock signal FBCLK is output as an output clock signal OUTCLK to a subsequent circuit (a flip-flop 135 and the like).

Figure 18:
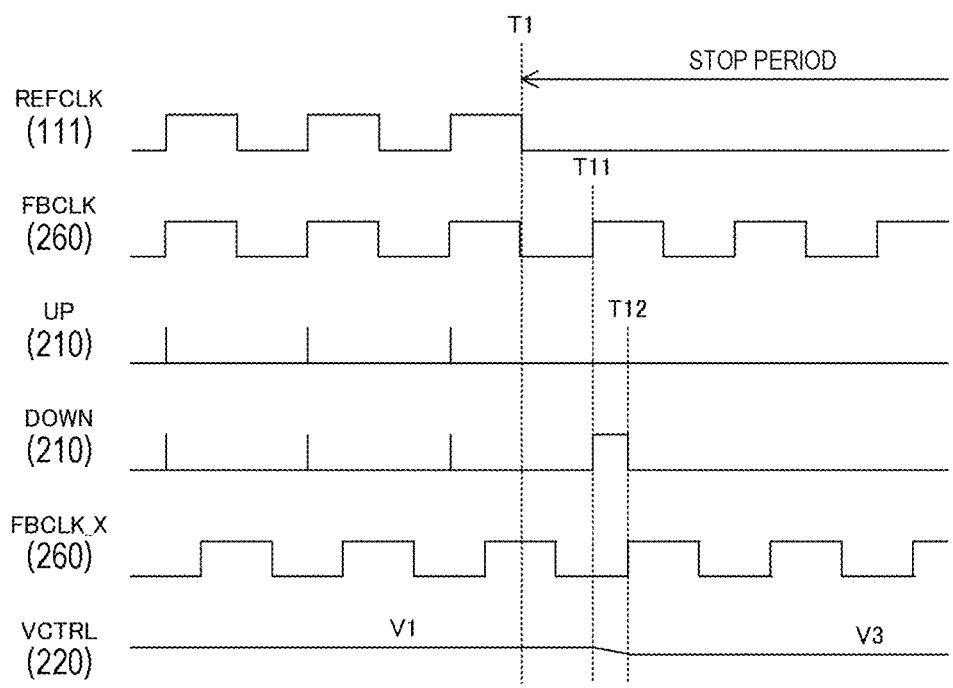
FIG. 18 is a timing chart illustrating an example of an operation of the PLL according to the fourth embodiment of the present technology.

FIG. 18 is a timing chart illustrating an example of an operation of the PLL 205 according to the fourth embodiment of the present technology. The feedback clock signal FBCLK_X rises at a timing T12 immediately after a rising timing T11 of the feedback clock signal FBCLK during a stop period. A control signal DOWN is reset to a low level at the timing T12, and decrease of the control voltage VCTRL is stopped. In accordance with the control voltage VCTRL at that time, the voltage-controlled oscillator 260 continues to supply the feedback clock signal FBCLK.

Figure 19:
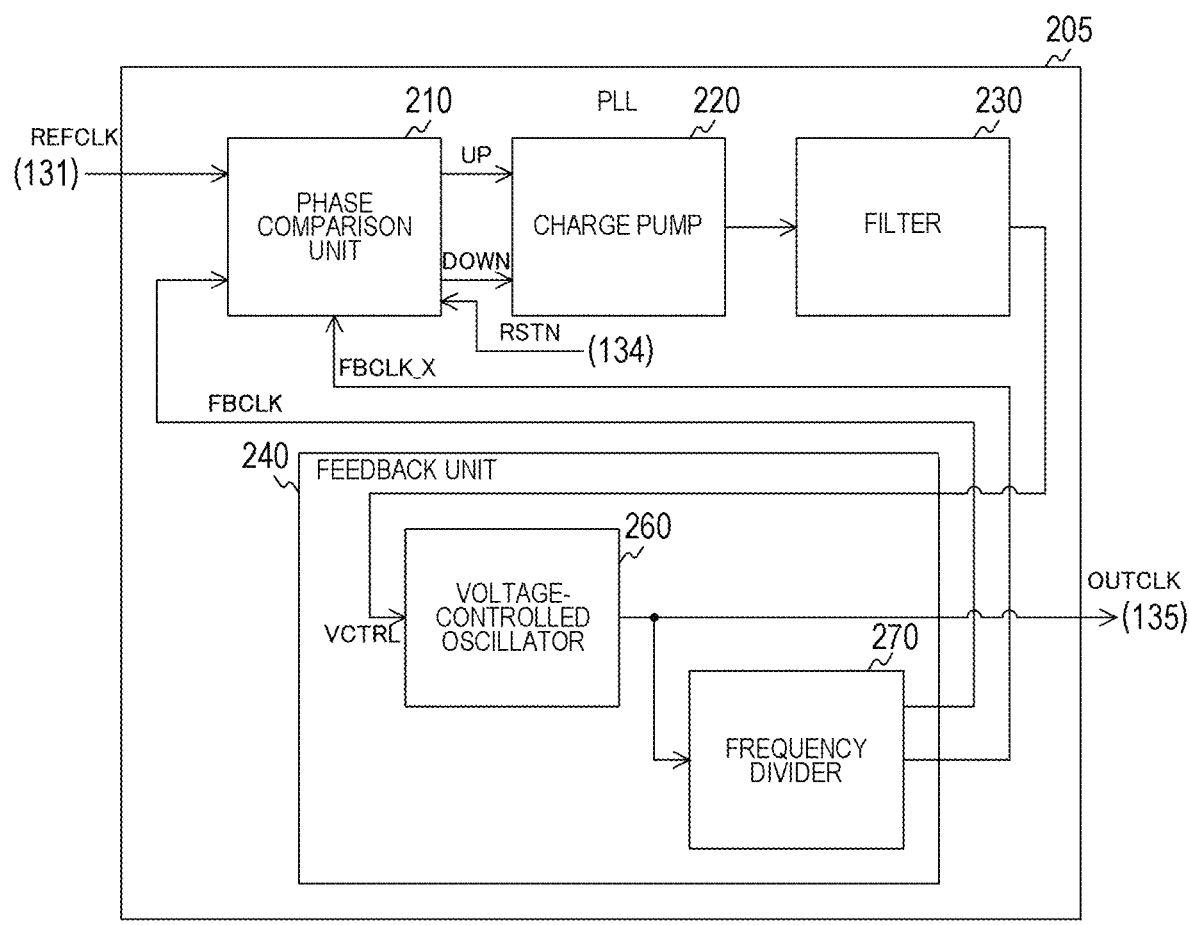
FIG. 19 is a block diagram illustrating another example of the PLL according to the fourth embodiment of the present technology.

Note that, as illustrated in FIG. 19, a frequency divider 270 may be further disposed in the feedback unit 240. In this case, the voltage-controlled oscillator 260 outputs a generated signal to a subsequent circuit as the output clock signal OUTCLK, and inputs the signal to the frequency divider 270. The frequency divider 270 divides a frequency of the clock signal to generate the feedback clock signal FBCLK and the feedback clock signal FBCLK_X, and supplies the feedback clock signal FBCLK and the feedback clock signal FBCLK_X to the phase comparison unit 210.

Furthermore, the third embodiment can also be applied to the fourth embodiment.

In this way, according to the fourth embodiment of the present technology, since the stop detection unit 320 is disposed in the PLL 205, a recovery time of the PLL 205 can be shortened.

5. Fifth Embodiment

In the second embodiment described above, the control signal DOWN has been initialized when the reference clock signal REFCLK is stopped. However, in a case where the stop period is long, the control voltage VCTRL may fluctuate due to a leakage current after initialization. A DLL 200 of this fifth embodiment is different from that of the second embodiment in that a control voltage VCTRL having fluctuated after initialization is corrected.

Figure 20:
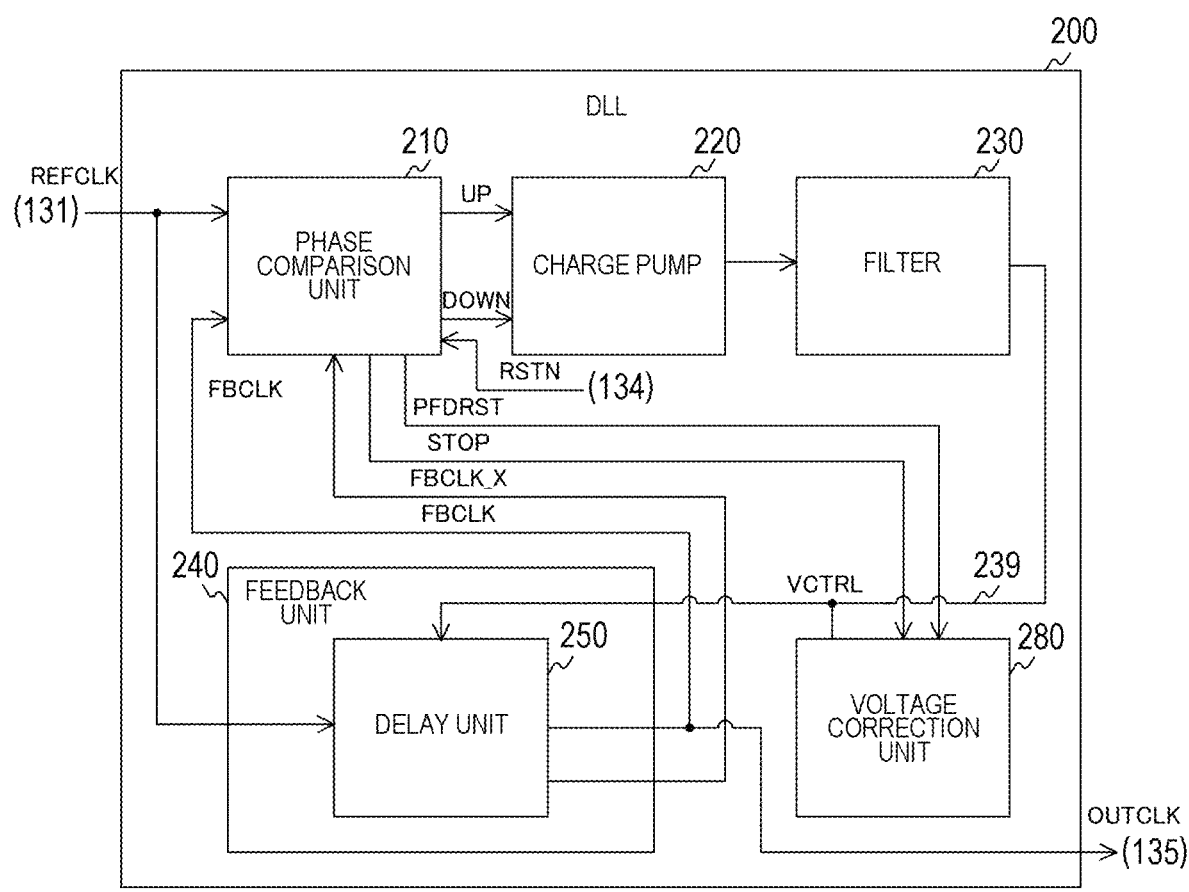
FIG. 20 is a block diagram illustrating a configuration example of a DLL according to a fifth embodiment of the present technology.

FIG. 20 is a block diagram illustrating a configuration example of the DLL 200 according to the fifth embodiment of the present technology. The DLL 200 of the fifth embodiment is different from that of the second embodiment in further including a voltage correction unit 280. This voltage correction unit 280 is connected to a control line 239 between a filter 230 and a feedback unit 240. Note that the stop detection unit 320 of the first embodiment can also be applied to the fifth embodiment.

The voltage correction unit 280 holds, as a held value, a value of the control voltage VCTRL when a control signal DOWN is initialized, and corrects the control voltage VCTRL to the held value when a stop period has elapsed.

Figure 21:
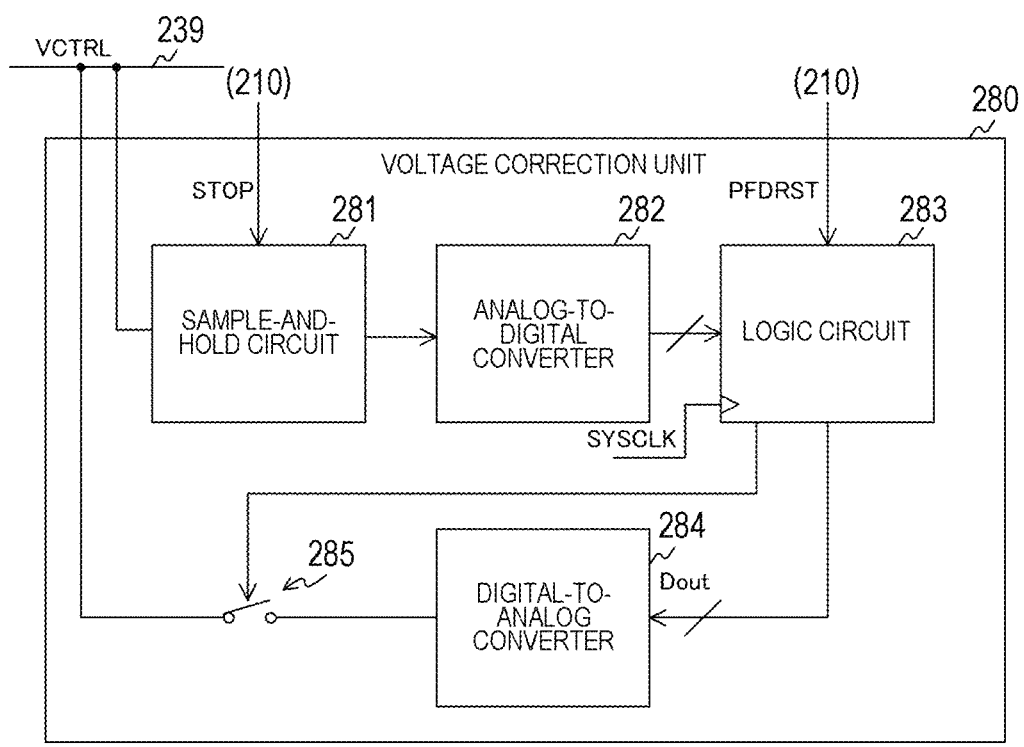
FIG. 21 is a block diagram illustrating a configuration example of a voltage correction unit according to the fifth embodiment of the present technology.

FIG. 21 is a block diagram illustrating a configuration example of the voltage correction unit 280 according to the fifth embodiment of the present technology. The voltage correction unit 280 includes a sample-and-hold circuit 281, an analog-to-digital converter 282, a logic circuit 283, a digital-to-analog converter 284, and a switch 285.

The sample-and-hold circuit 281 samples and holds the control voltage VCTRL of the control line 239 in synchronization with a detection signal STOP from a phase comparison unit 210. The analog-to-digital converter 282 converts a voltage held by the sample-and-hold circuit 281 into a digital signal Dout. The analog-to-digital converter 282 supplies the digital signal Dout to the logic circuit 283.

The logic circuit 283 performs control to correct a voltage when the stop period has elapsed. When the digital signal Dout is output from the analog-to-digital converter 282, the logic circuit 283 holds the signal in a memory or the like. Then, the logic circuit 283 supplies the digital signal Dout to the digital-to-analog converter 284 at a timing when a reset signal PFDRST from the phase comparison unit 210 rises, and controls the switch 285 to be in a closed state.

The digital-to-analog converter 284 converts the digital signal Dout from the logic circuit 283 into a voltage, and supplies the voltage to the switch 285. The switch 285 opens and closes a path between the digital-to-analog converter 284 and the control line 239 under control of the logic circuit 283.

Figure 22:
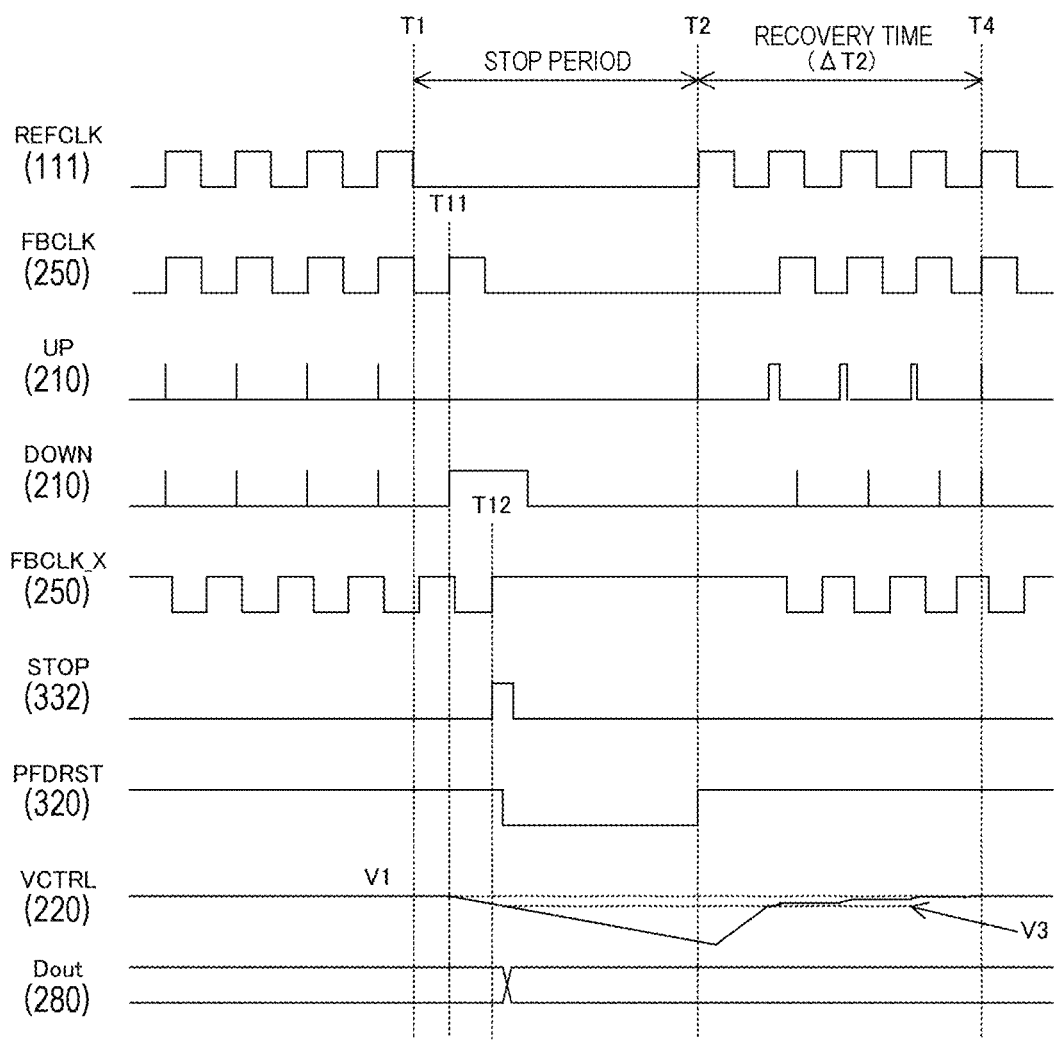
FIG. 22 is a timing chart illustrating an example of an operation of the DLL according to the fifth embodiment of the present technology.

FIG. 22 is a timing chart illustrating an example of an operation of the DLL 200 according to the fifth embodiment of the present technology. When the detection signal STOP rises at a timing T12 during the stop period, immediately thereafter, the voltage correction unit 280 converts a level V3 of the control voltage VCTRL at the time of initialization into the digital signal Dout, and holds the digital signal Dout. Here, it is assumed that the control voltage VCTRL fluctuates after initialization due to a leakage current and becomes a value lower than the level V3 at the time of initialization.

Then, when the reset signal PFDRST rises at a timing T2 when the stop period has elapsed, the voltage correction unit 280 converts the held digital signal Dout into the level V3 before the fluctuation due to the leakage current, and corrects the control voltage VCTRL to that level.

Note that the third embodiment and the fourth embodiment can also be applied to the fifth embodiment.

In this way, according to the fifth embodiment of the present technology, the voltage correction unit 280 holds the control voltage VCTRL at the time of initialization, and corrects the control voltage VCTRL to the held value when the stop period has elapsed. As a result, even if the control voltage VCTRL fluctuates after initialization due to the leakage current, the level before the fluctuation can be applied.

6. Sixth Embodiment

In the first embodiment described above, the stop detection unit 320 has detected stop of the reference clock signal REFCLK, and initialized the control signal DOWN. However, in this configuration, the control voltage VCTRL decreases within a period before initialization. A DLL 200 of this sixth embodiment is different from that of the first embodiment in that a control voltage VCTRL is compensated on the basis of a fluctuation amount. Here, "compensation" means that, when the control voltage VCTRL fluctuates from V1 to V3 during a stop period, the control voltage VCTRL is returned to V1 that is of before the fluctuation.

Figure 23:
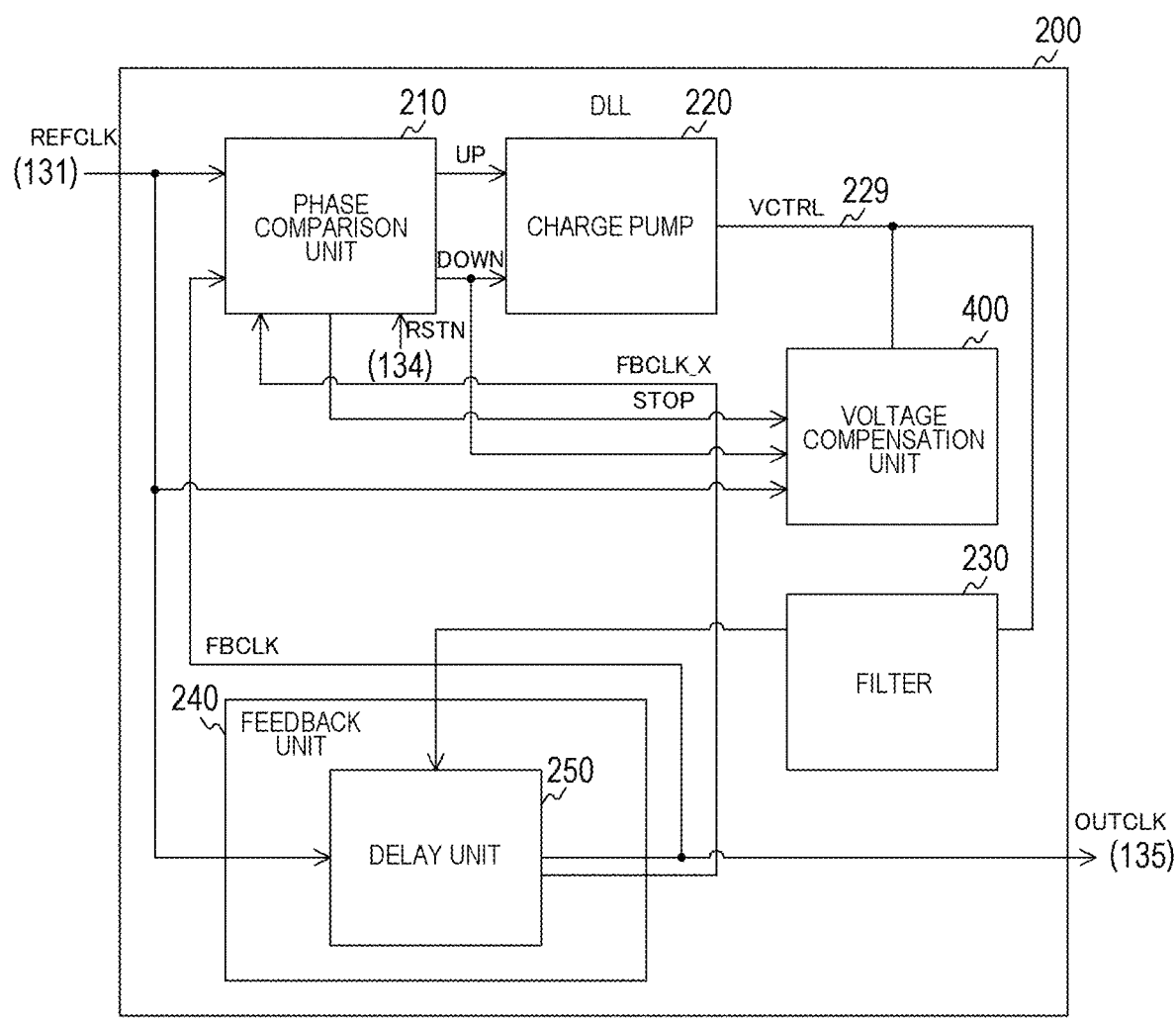
FIG. 23 is a block diagram illustrating a configuration example of a DLL according to a sixth embodiment of the present technology.

FIG. 23 is a block diagram illustrating a configuration example of the DLL 200 according to the sixth embodiment of the present technology. The DLL 200 of the sixth embodiment is different from that of the first embodiment in further including a voltage compensation unit 400.

The voltage compensation unit 400 compensates the control voltage VCTRL on the basis of a fluctuation amount of the control voltage VCTRL during a stop period of a reference clock signal REFCLK.

Figure 24:
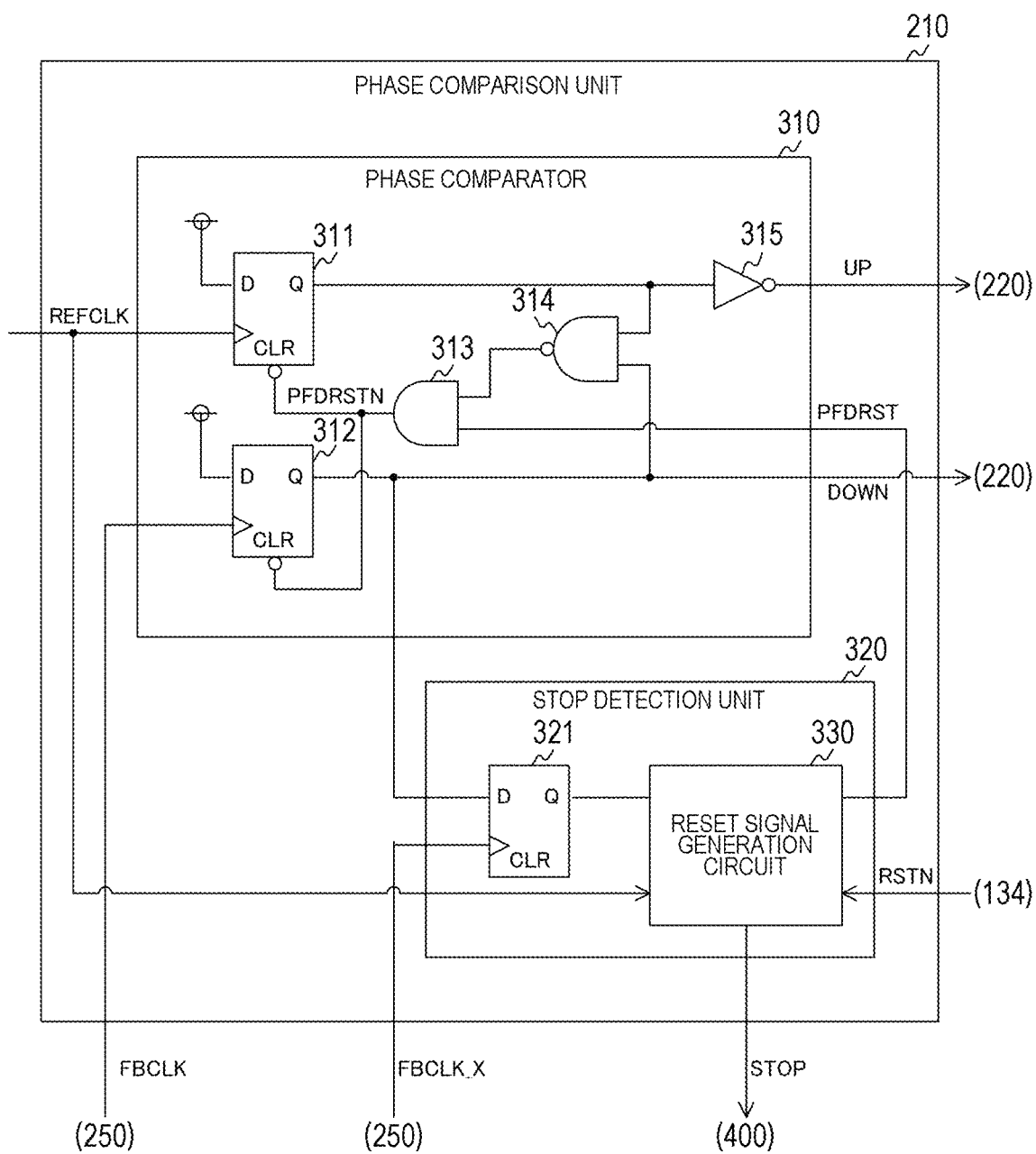
FIG. 24 is a circuit diagram illustrating a configuration example of a phase comparison unit according to the sixth embodiment of the present technology.

FIG. 24 is a circuit diagram illustrating a configuration example of a phase comparison unit 210 according to the sixth embodiment of the present technology. The phase comparison unit 210 of this sixth embodiment is different from that of the first embodiment in further including an inverter 315 in a phase comparator 310. The inverter 315 inverts a signal output from a flip-flop 311 and supplies the signal to a charge pump 220, as a control signal UP.

Furthermore, a reset signal generation circuit 330 of the sixth embodiment supplies a detection signal STOP to the voltage compensation unit 400.

Figure 25:
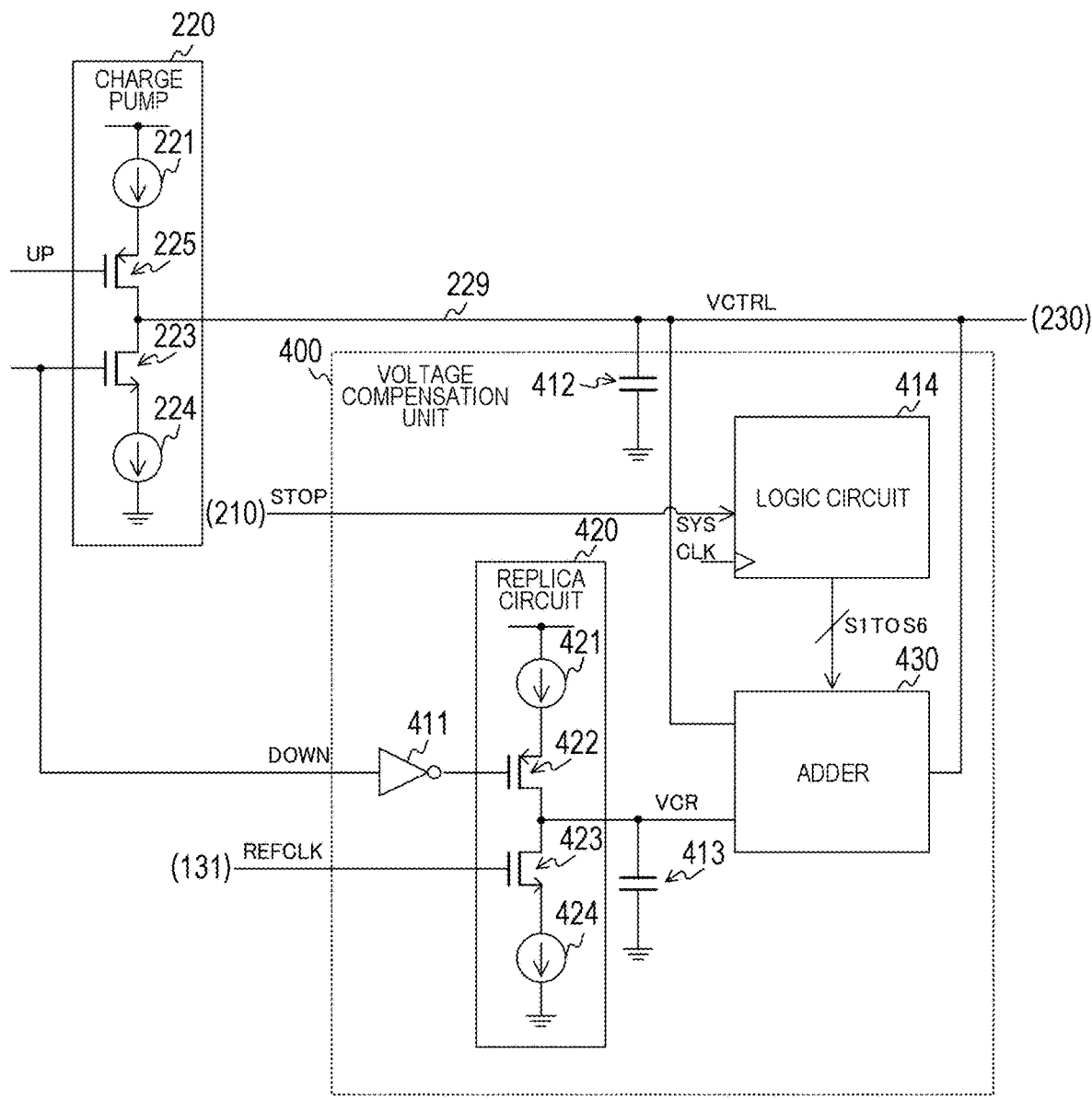
FIG. 25 is a circuit diagram illustrating a configuration example of a charge pump and a voltage compensation unit according to the sixth embodiment of the present technology.

FIG. 25 is a circuit diagram illustrating a configuration example of the charge pump 220 and the voltage compensation unit 400 according to the sixth embodiment of the present technology. The charge pump 220 of the sixth embodiment includes a p-channel MOS (pMOS) transistor 225 instead of the nMOS transistor 222.

The voltage compensation unit 400 includes an inverter 411, a replica circuit 420, capacitive elements 412 and 413, a logic circuit 414, and an adder 430. The replica circuit 420 includes a current source 421, a pMOS transistor 422, an nMOS transistor 423, and a current source 424.

The current source 421, the pMOS transistor 422, the nMOS transistor 423, and the current source 424 are connected in series between a power supply terminal and a ground terminal. The inverter 411 inverts a control signal DOWN from the phase comparison unit 210, and supplies the signal to a gate of the pMOS transistor 422. Furthermore, the reference clock signal REFCLK is input to a gate of the nMOS transistor 423. A voltage VCR at a connection node between the pMOS transistor 422 and the nMOS transistor 423 is supplied to the adder 430 and the capacitive element 413.

With the circuit configuration described above, when a high-level control signal DOWN is supplied during the stop period, the voltage VCR increases. A fluctuation amount (that is, an increase amount) of this voltage VCR is equal in absolute value to a fluctuation amount (that is, a decrease amount) of the control voltage VCTRL due to the control signal DOWN, and has a different sign. The fluctuation amount of the voltage VCR is hereinafter referred to as a "compensation amount".

The capacitive element 412 holds the control voltage VCTRL of a control line 229 connected to the charge pump 220. The capacitive element 413 holds the voltage VCR.

The adder 430 adds the fluctuation amount (compensation amount) of the voltage VCR to the control voltage VCTRL, under control of the logic circuit 414. The logic circuit 414 controls the adder 430 to add the compensation amount when the detection signal STOP is input. Note that the adder 430 is an example of an arithmetic unit described in the claims.

Note that, similarly to the first embodiment, the nMOS transistor 222 can be disposed in the charge pump 220. In this case, the inverter 315 at a preceding stage of the charge pump 220 becomes unnecessary. Furthermore, in the replica circuit 420, an nMOS transistor is disposed instead of the pMOS transistor 422, and the inverter 411 in a preceding stage becomes unnecessary.

Figure 26:
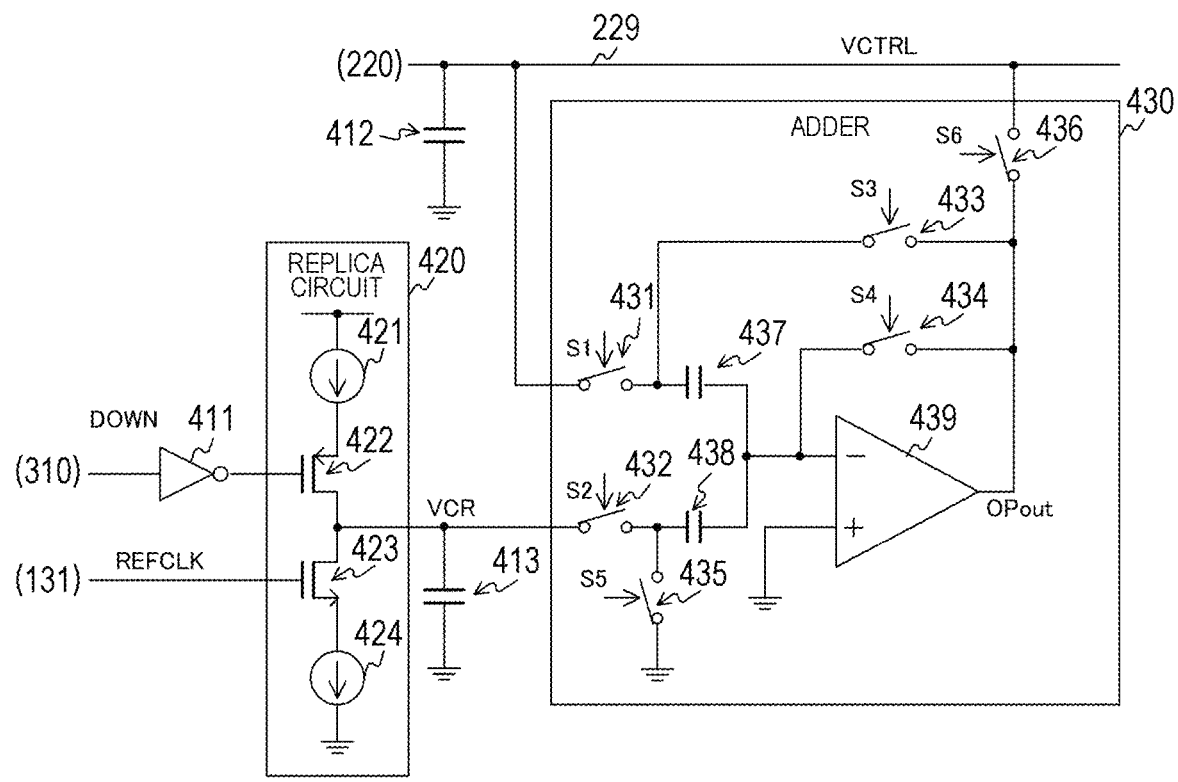
FIG. 26 is a circuit diagram illustrating a configuration example of a replica circuit and an adder according to the sixth embodiment of the present technology.

FIG. 26 is a circuit diagram illustrating a configuration example of the replica circuit 420 and the adder 430 according to the sixth embodiment of the present technology. The adder 430 includes switches 431 to 436, capacitive elements 437 and 438, and an operational amplifier 439.

One ends of the capacitive elements 437 and 438 are connected in common to an inverting-input terminal (−) of the operational amplifier 439. Furthermore, a non-inverting-input terminal (+) of the operational amplifier 439 is connected to a ground terminal. The switch 431 opens and closes a path between the control line 229 and another end of the capacitive element 437, in response to a control signal S1 from the logic circuit 414. The switch 432 opens and closes a path between the replica circuit 420 and another end of the capacitive element 438, in response to a control signal S2 from the logic circuit 414.

The switch 433 opens and closes a path between a connection node between the switch 431 and the capacitive element 437 and an output terminal of the operational amplifier 439, in response to a control signal S3 from the logic circuit 414. The switch 434 opens and closes a path between an input terminal and the output terminal of the operational amplifier 439, in response to a control signal S4 from the logic circuit 414.

The switch 435 opens and closes a path between a connection node between the switch 432 and the capacitive element 438 and a ground terminal, in response to a control signal S5 from the logic circuit 414. The switch 436 opens and closes a path between the output terminal of the operational amplifier 439 and the control line 229, in response to a control signal S6 from the logic circuit 414.

Furthermore, for example, the switches 431 to 436 are in a closed state when the corresponding control signal is a high level, and are in an open state when the corresponding control signal is a low level.

Note that the switch 431 is an example of a first switch described in the claims, and the switch 432 is an example of a second switch described in the claims. The switch 433 is an example of a third switch described in the claims, and the switch 434 is an example of a fourth switch described in the claims. The switch 435 is an example of a fifth switch described in the claims, and the switch 436 is an example of a sixth switch described in the claims. The capacitive elements 437 and 438 are examples of first and second capacitive elements described in the claims.

Figure 27:
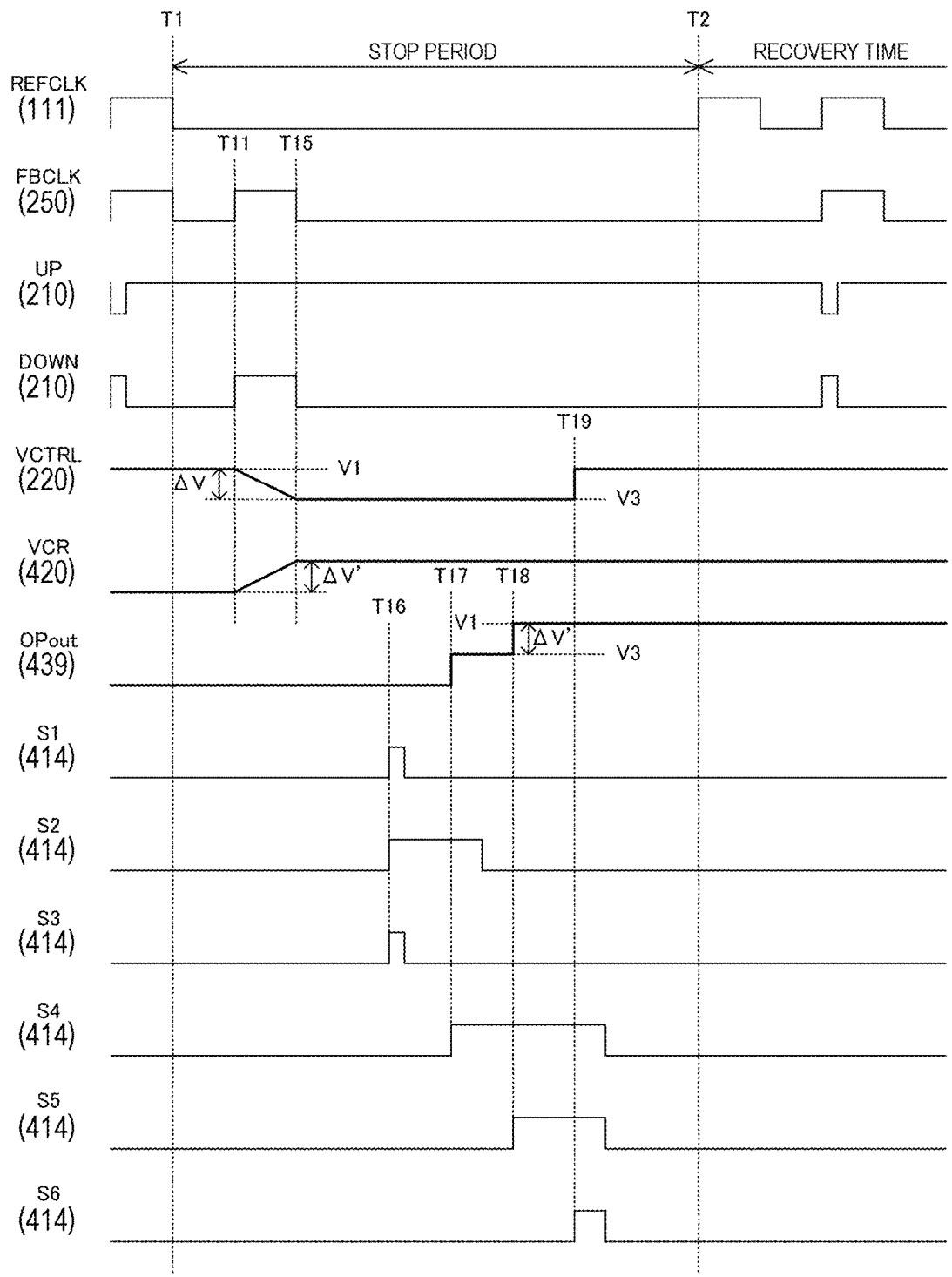
FIG. 27 is a timing chart illustrating an example of an operation of the DLL according to the sixth embodiment of the present technology.

FIG. 27 is a timing chart illustrating an example of an operation of the DLL 200 according to the sixth embodiment of the present technology. A feedback clock signal FBCLK rises at a timing T11 after a timing T1 at which the reference clock signal REFCLK is stopped. Immediately thereafter, a stop detection unit 320 detects the stop of the reference clock signal REFCLK, and initializes the control signal DOWN at a timing T15.

The control voltage VCTRL decreases from V1 to V3 in response to the control signal DOWN from the timing T11 to the timing T15. Assuming that a fluctuation amount is ΔV, ΔV is expressed by the following formula.

$$\Delta V = V3 - V1$$

Whereas, the voltage VCR output from the replica circuit 420 increases within the period from the timing T11 to the timing T15. Assuming that a fluctuation amount (compensation amount) thereof is ΔV', ΔV' is expressed by the following formula.

$$\Delta V' = -\Delta V$$

The logic circuit 414 sets the control signals S1 to S3 to a high level at a timing T16 after the timing T15, and sets the control signals S1 and S3 to a low level after elapse of a pulse period. Then, the logic circuit 414 sets the control signal S4 to a high level at a timing T17 after the timing T16. This control causes a voltage OPout of the output terminal of the operational amplifier 439 to increase up to V3.

Then, the logic circuit 414 sets the control signal S2 to a low level immediately after the timing T17, and sets the control signal S5 to a high level at a timing T18. This control causes the compensation amount ΔV' to be added to the voltage OPout of the output terminal of the operational amplifier 439, and the voltage OPout increases up to V1.

The logic circuit 414 sets the control signal S6 to a high level at a timing T19 after the timing T18. This control causes the control voltage VCTRL to be compensated by the compensation amount ΔV' and increase up to V1 that is of before the fluctuation. As a result, after the timing T2, a recovery time becomes shorter than that in a case where compensation is not performed.

For example, in a comparative example in which the stop detection unit 320 and the voltage compensation unit 400 are not provided, the recovery time may reach several tens of nanoseconds (ns), and it becomes difficult to satisfy requirements of a standard such as the MIPI. By providing the stop detection unit 320 and the voltage compensation unit 400, the recovery time can be shortened to, for example, ten nanoseconds (ns).

Note that, although the phase comparator 310 that outputs the control signal DOWN during the stop period is used, a phase comparator 310 that outputs the control signal UP may also be used instead. In this case, the control signal UP may be input to the replica circuit 420, a subtractor may be provided instead of the adder 430, and the subtractor may decrease the control voltage VCTRL by an amount of an increase in the control voltage VCTRL.

Furthermore, the second embodiment and the third embodiment can be applied to the sixth embodiment.

In this way, according to the sixth embodiment of the present technology, since the voltage compensation unit 400 compensates the control voltage VCTRL on the basis of a fluctuation amount of the control voltage VCTRL during the stop period, it is possible to shorten the recovery time as compared with a case where compensation is not performed.

7. Seventh Embodiment

In the sixth embodiment described above, when the stop detection unit 320 has detected stop of the reference clock signal REFCLK, the voltage compensation unit 400 has performed voltage compensation. However, in this configuration, it is necessary to provide the stop detection unit 320 in the phase comparison unit 210. A DLL 200 of this seventh embodiment is different from that of the sixth embodiment in that a voltage compensation unit 400 performs compensation when a comparison result between a control voltage VCTRL and a lower limit voltage is inverted.

Figure 28:
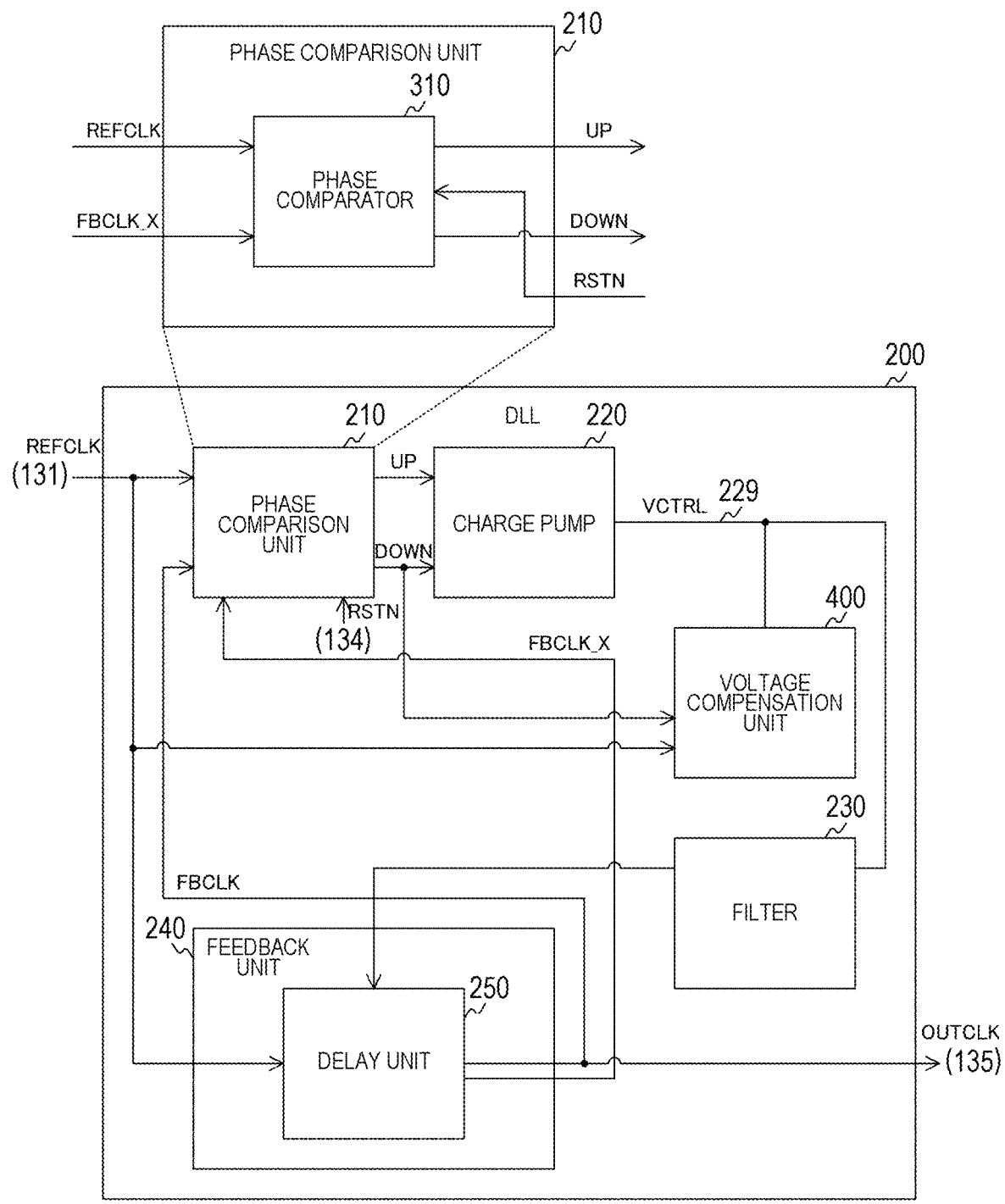
FIG. 28 is a block diagram illustrating a configuration example of a DLL according to a seventh embodiment of the present technology.

FIG. 28 is a block diagram illustrating a configuration example of the DLL 200 according to the seventh embodiment of the present technology. The DLL 200 of the seventh embodiment is different from that of the sixth embodiment in that a stop detection unit 320 is not disposed in a phase comparison unit 210.

Figure 29:
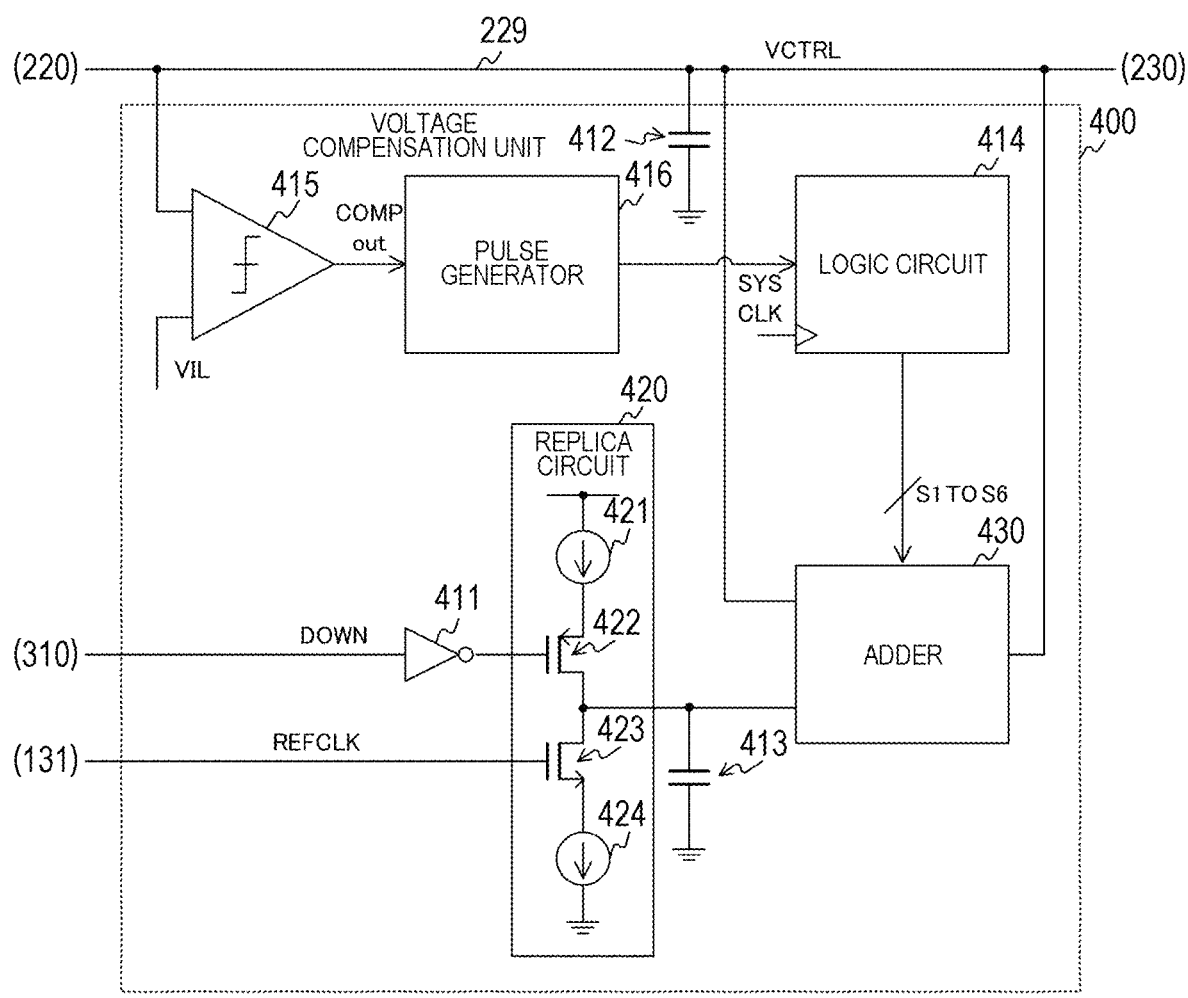
FIG. 29 is a circuit diagram illustrating a configuration example of a voltage compensation unit according to the seventh embodiment of the present technology.

FIG. 29 is a circuit diagram illustrating a configuration example of the voltage compensation unit 400 according to the seventh embodiment of the present technology. The voltage compensation unit 400 of the seventh embodiment is different from that of the sixth embodiment in further including a comparator 415 and a pulse generator 416.

The comparator 415 compares the control voltage VCTRL with a predetermined lower limit voltage VIL. The comparator 415 supplies a comparison result COMPout to the pulse generator 416.

The pulse generator 416 generates a pulse signal when the comparison result COMPout is inverted (in other words, when the control voltage VCTRL falls below the lower limit voltage VIL). This pulse generator 416 supplies the pulse signal to a logic circuit 414.

Figure 30:
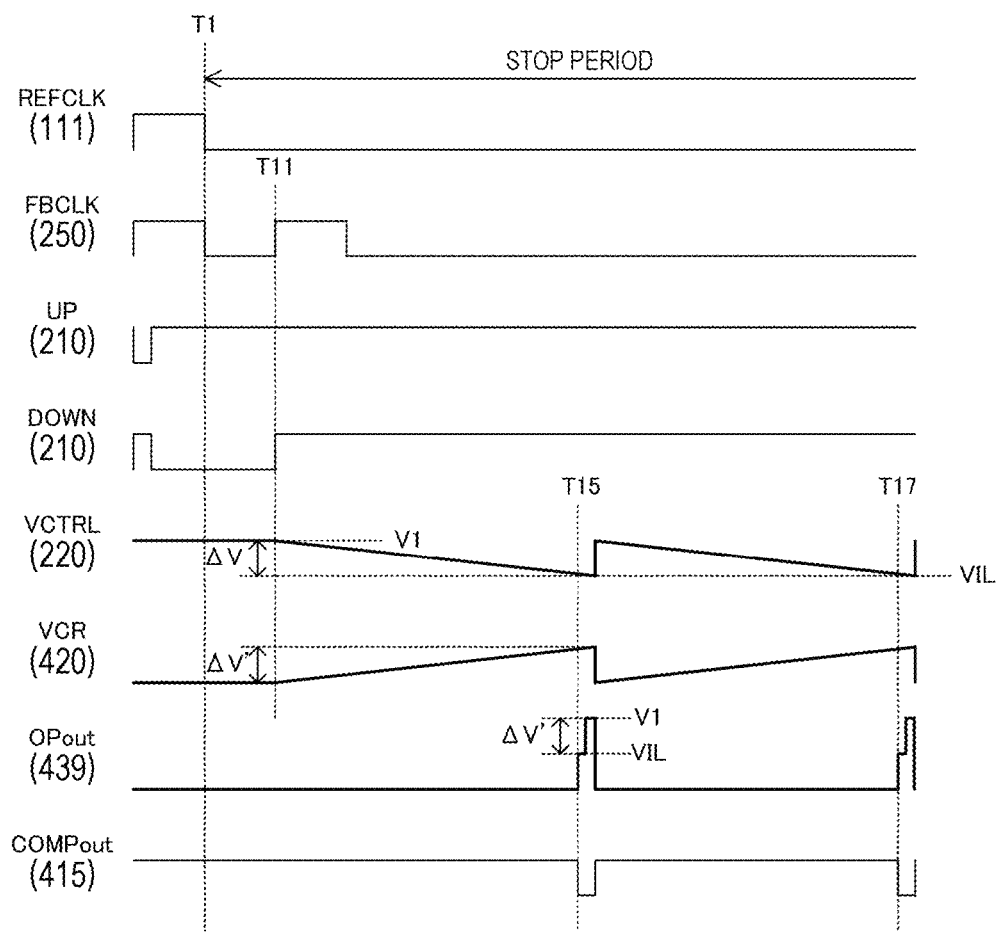
FIG. 30 is a timing chart illustrating an example of an operation of the DLL according to the seventh embodiment of the present technology.

FIG. 30 is a timing chart illustrating an example of an operation of the DLL 200 according to the sixth embodiment of the present technology. After a timing T11 during a stop period, the phase comparison unit 210 outputs a high-level control signal DOWN. This control signal DOWN gradually decreases the control voltage VCTRL.

Then, when the control voltage VCTRL falls below the lower limit voltage VIL at a timing T15, the comparison result COMPout of the comparator 415 is inverted. Assuming that a fluctuation amount of the control voltage VCTRL from the timing T11 to the timing T15 is ΔV, an absolute value of a fluctuation amount (compensation amount) ΔV' of a voltage VCR output from the replica circuit 420 is equal to ΔV.

Immediately after the timing T15, an adder 430 adds ΔV' similarly to the sixth embodiment. As a result, the control voltage VCTRL is compensated.

When the stop period continues, the control voltage VCTRL decreases again due to the control signal DOWN. Then, when the control voltage VCTRL falls below the lower limit voltage VIL at a timing T17, the comparison result COMPout of the comparator 415 is inverted again, and the voltage compensation unit 400 compensates for the control voltage VCTRL. Thereafter, similar control is repeated until the stop period elapses.

Note that, although a phase comparator 310 that outputs the control signal DOWN during the stop period is used, a phase comparator 310 that outputs the control signal UP may also be used instead. In this case, the comparator 415 is only required to compare the control voltage VCTRL with an upper limit voltage.

In this way, according to the seventh embodiment of the present technology, since the voltage compensation unit 400 performs compensation to perform compensation when the comparison result between the control voltage VCTRL and the lower limit voltage (or the upper limit voltage) is inverted, the number of stop detection units 320 can be reduced.

8. Eighth Embodiment

In the sixth embodiment described above, the voltage compensation unit 400 has compensated the voltage. However, it is necessary to use an analog circuit including an operational amplifier and a capacitive element, and it is difficult to reduce a circuit scale. A DLL 200 of this eighth embodiment is different from that of the sixth embodiment in that a voltage is compensated using a digital circuit.

Figure 31:
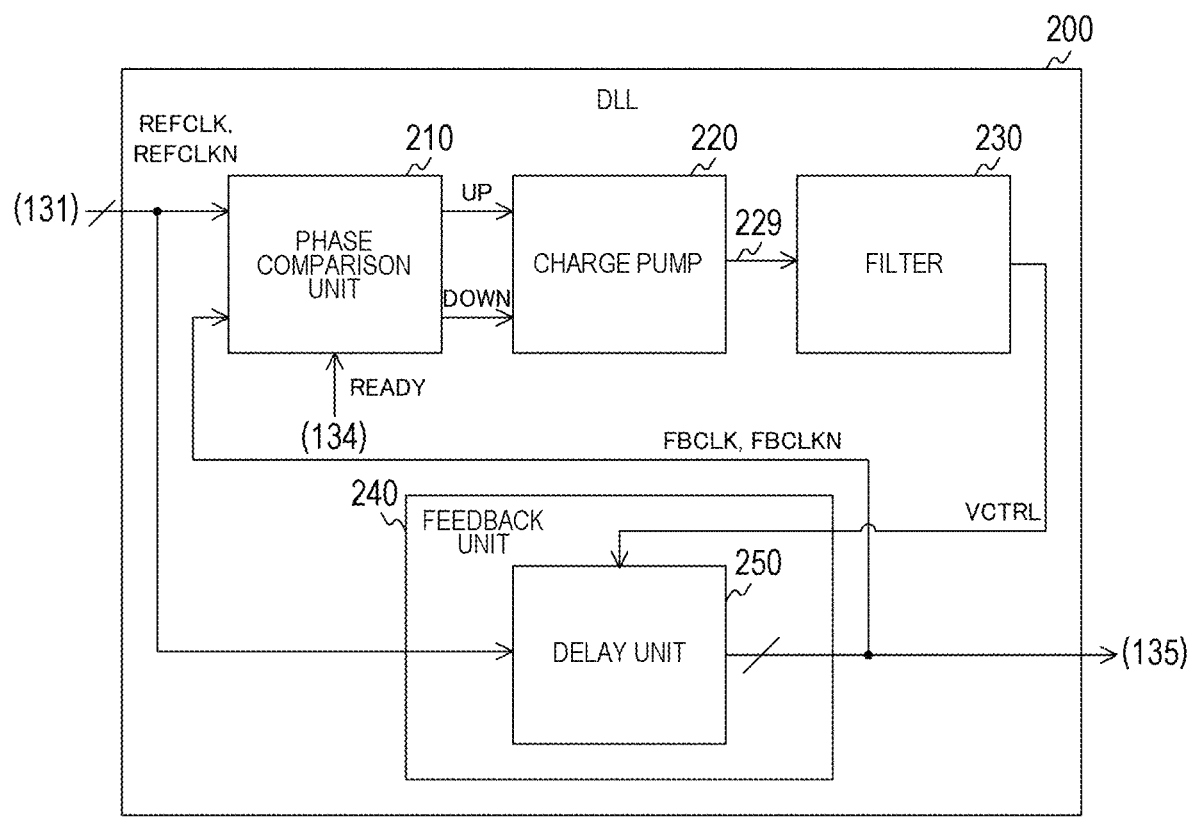
FIG. 31 is a block diagram illustrating a configuration example of a DLL according to an eighth embodiment of the present technology.

FIG. 31 is a block diagram illustrating a configuration example of the DLL 200 according to the eighth embodiment of the present technology. The DLL 200 of the eighth embodiment is different from that of the sixth embodiment in that a voltage compensation unit 400 is not connected to a control line 229.

Furthermore, a reference clock signal REFCLK and a reference clock signal REFCLKN having a phase different from that of the reference clock signal REFCLK by 180 degrees are input to the DLL 200 of the eighth embodiment. Furthermore, a delay unit 250 delays the reference clock signals REFCLK and REFCLKN with different delay lines to generate feedback clock signals FBCLK and FBCLKN, and supplies the feedback clock signals FBCLK and FBCLKN to a phase comparison unit 210.

Figure 32:
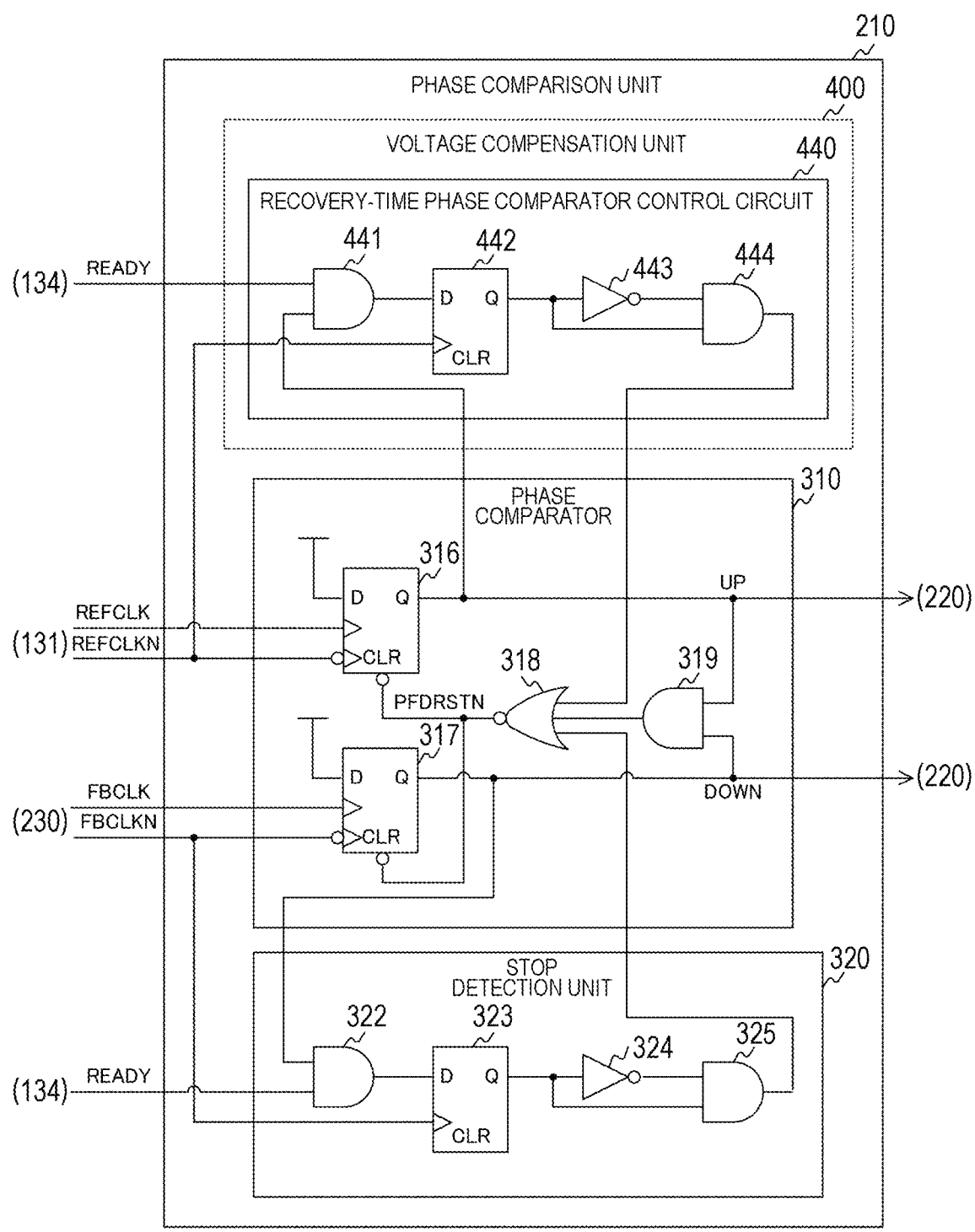
FIG. 32 is a circuit diagram illustrating a configuration example of a phase comparison unit according to the eighth embodiment of the present technology.

FIG. 32 is a circuit diagram illustrating a configuration example of the phase comparison unit 210 according to the eighth embodiment of the present technology. The phase comparison unit 210 of the eighth embodiment is different from that of the sixth embodiment in further including the voltage compensation unit 400. The voltage compensation unit 400 includes a recovery-time phase comparator control circuit 440. The recovery-time phase comparator control circuit 440 includes an AND gate 441, a flip-flop 442, an inverter 443, and an AND gate 444.

Furthermore, a phase comparator 310 of the eighth embodiment includes flip-flops 316 and 317, a NOR (negative logical sum) gate 318, and an AND gate 319. A stop detection unit 320 of the eighth embodiment includes an AND gate 322, a flip-flop 323, an inverter 324, and an AND gate 325.

In the phase comparator 310, the flip-flop 316 captures and holds a high level in synchronization with the reference clock signals REFCLK and REFCLKN. The flip-flop 316 includes a non-inverting-input clock terminal and an inverting-input clock terminal, and the reference clock signal REFCLK is input to the non-inverting-input side and the reference clock signal REFCLKN is input to the inverting-input side. Furthermore, the flip-flop 316 outputs a held value as a control signal UP, to a charge pump 220, the AND gate 319, and the recovery-time phase comparator control circuit 440.

The flip-flop 317 captures and holds a high level in synchronization with the feedback clock signals FBCLK and FBCLKN. The flip-flop 317 includes a non-inverting-input clock terminal and an inverting-input clock terminal, and the feedback clock signal FBCLK is input to the non-inverting-input side and the feedback clock signal FBCLKN is input to the inverting-input side. Furthermore, the flip-flop 317 outputs a held value as a control signal DOWN, to the charge pump 220, the AND gate 319, and the stop detection unit 320.

The AND gate 319 outputs a logical product of the control signal UP and the control signal DOWN, to the NOR gate 318. The NOR gate 318 outputs, as a control signal PFDRSTN, a negative logical sum of individual signals from the recovery-time phase comparator control circuit 440, the AND gate 319, and the stop detection unit 320. The control signal PFDRSTN is input to an inverting-input clear terminal of each of the flip-flops 316 and 317.

In the stop detection unit 320, the AND gate 322 outputs a logical product of a control signal READY from a control unit 134 and the control signal DOWN from the phase comparator 310, to an input terminal of the flip-flop 323.

The flip-flop 323 captures and holds a signal from the AND gate 322 in synchronization with the feedback clock signal FBCLKN. The flip-flop 323 supplies a held control signal DOWN to the inverter 324 and the AND gate 325.

The inverter 324 inverts a signal from the flip-flop 323, and outputs the signal to the AND gate 325. The AND gate 325 supplies, as a reset signal, a logical product of the signal from the flip-flop 323 and the inverted signal from the inverter 324, to the NOR gate 318.

In the recovery-time phase comparator control circuit 440, the AND gate 441 outputs a logical product of the control signal READY and the control signal UP from the phase comparator 310, to the input terminal of the flip-flop 442.

The flip-flop 442 captures and holds a signal from the AND gate 441 in synchronization with the reference clock signal REFCLKN. The flip-flop 442 supplies a held signal to the inverter 443 and the AND gate 444.

The inverter 443 inverts a signal from the flip-flop 442, and outputs the signal to the AND gate 444. The AND gate 444 supplies, as a reset signal, a logical product of the signal from the flip-flop 442 and the inverted signal from the inverter 443, to the NOR gate 318.

With the circuit configuration described above, the stop detection unit 320 outputs a reset signal when a predetermined period dt has elapsed from a start of output of the control signal DOWN during the stop period of the reference clock signal REFCLK, and initializes the control signal DOWN.

Furthermore, the recovery-time phase comparator control circuit 440 outputs a reset signal when the predetermined period dt has elapsed from a start of output of the control signal UP after an end of the stop period of the reference clock signal REFCLK, and initializes the control signal UP.

As illustrated in the figure, since the voltage compensation unit 400 includes a digital circuit, a circuit scale can be reduced as compared with the sixth embodiment using an analog circuit.

Figures 33, 34:
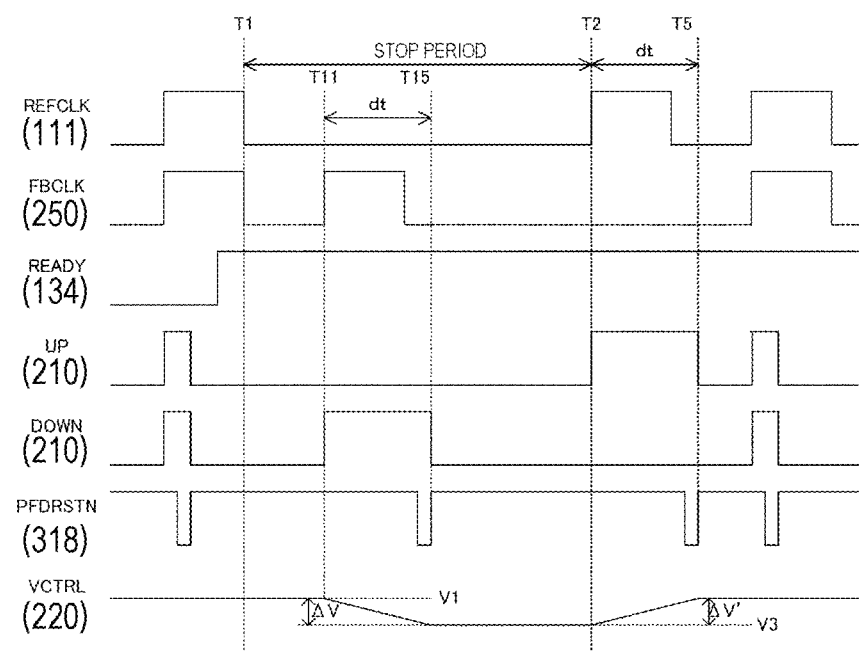
FIG. 33 is a view illustrating an example of an operation of a flip-flop according to the eighth embodiment of the present technology.
FIG. 34 is a timing chart illustrating an example of an operation of the DLL according to the eighth embodiment of the present technology.

FIG. 33 is a view illustrating an example of an operation of the flip-flop 316 according to the eighth embodiment of the present technology. The flip-flop 316 includes a clear terminal CLR, a clock terminal clk+, a clock terminal clk-, a data input terminal D, and an output terminal Q. In the figure, "H" indicates a high level, and "L" indicates a low level. Furthermore, "t" indicates rising of a signal, and "!" indicates falling of a signal.

When a low level is input to the inverting-input clear terminal CLR, the low level is output from the output terminal Q regardless of values of the clock terminal and the data input terminal D. When a high level is input to the clear terminal CLR, and a state of the non-inverting-input clock terminal clk+ is other than rising, or a state of the inverting-input clock terminal clk- is other than falling, the flip-flop 316 is in a holding state, and a held value is output from the output terminal Q. Furthermore, when a high level is input to the clear terminal CLR, a state of the clock terminal clk+ is rising, and a state of the clock terminal clk- is falling, the flip-flop 316 is in a through state, and a value of the data input terminal D is output as it is from the output terminal Q.

Note that a circuit configuration of the flip-flop 317 is similar to that of the flip-flop 316.

FIG. 34 is a timing chart illustrating an example of an operation of the DLL 200 according to the sixth embodiment of the present technology. When output of the control signal DOWN is started at a timing T11 during a stop period, the stop detection unit 320 outputs a reset signal at a timing when a predetermined period has elapsed. At a timing T15 immediately thereafter, the control signal DOWN is initialized to a low level by the reset signal. This control causes a control voltage VCTRL to decrease over the period dt, and a fluctuation amount thereof becomes ΔV.

Then, when output of the control signal UP is started at a timing T2 at the time of recovery, the recovery-time phase comparator control circuit 440 outputs a reset signal at a timing when a predetermined period has elapsed. At a timing T5 immediately thereafter, the control signal UP is initialized to a low level by the reset signal. This control causes the control voltage VCTRL to increase over the period dt, and a fluctuation amount (compensation amount) thereof becomes ΔV' equal in absolute value to ΔV.

As illustrated in the figure, when the reference clock signal REFCLK is stopped, the stop detection unit 320 causes the control signal DOWN to be output over a predetermined period. Then, when the reference clock signal REFCLK is resumed, the recovery-time phase comparator control circuit 440 causes the control signal UP to be output over the same period as the output period of the control signal DOWN. As a result, the control voltage VCTRL is compensated.

Note that, although a phase comparator 310 that outputs the control signal DOWN during the stop period is used, a phase comparator 310 that outputs the control signal UP may also be used instead. In this case, the stop detection unit 320 is only required to initialize the control signal UP during the stop period, and the recovery-time phase comparator control circuit 440 is only required to initialize the control signal DOWN at the time of recovery.

In this way, according to the eighth embodiment of the present technology, since the voltage is compensated by the recovery-time phase comparator control circuit 440 which is a digital circuit, a circuit scale can be reduced as compared with the sixth embodiment using an analog circuit.

9. Ninth Embodiment

In the sixth embodiment described above, the voltage compensation unit 400 has been disposed in the DLL 200, but the voltage compensation unit 400 can also be applied to a PLL. This ninth embodiment is different from the ninth embodiment in that a voltage compensation unit 400 is applied to a PLL.

Figure 35:
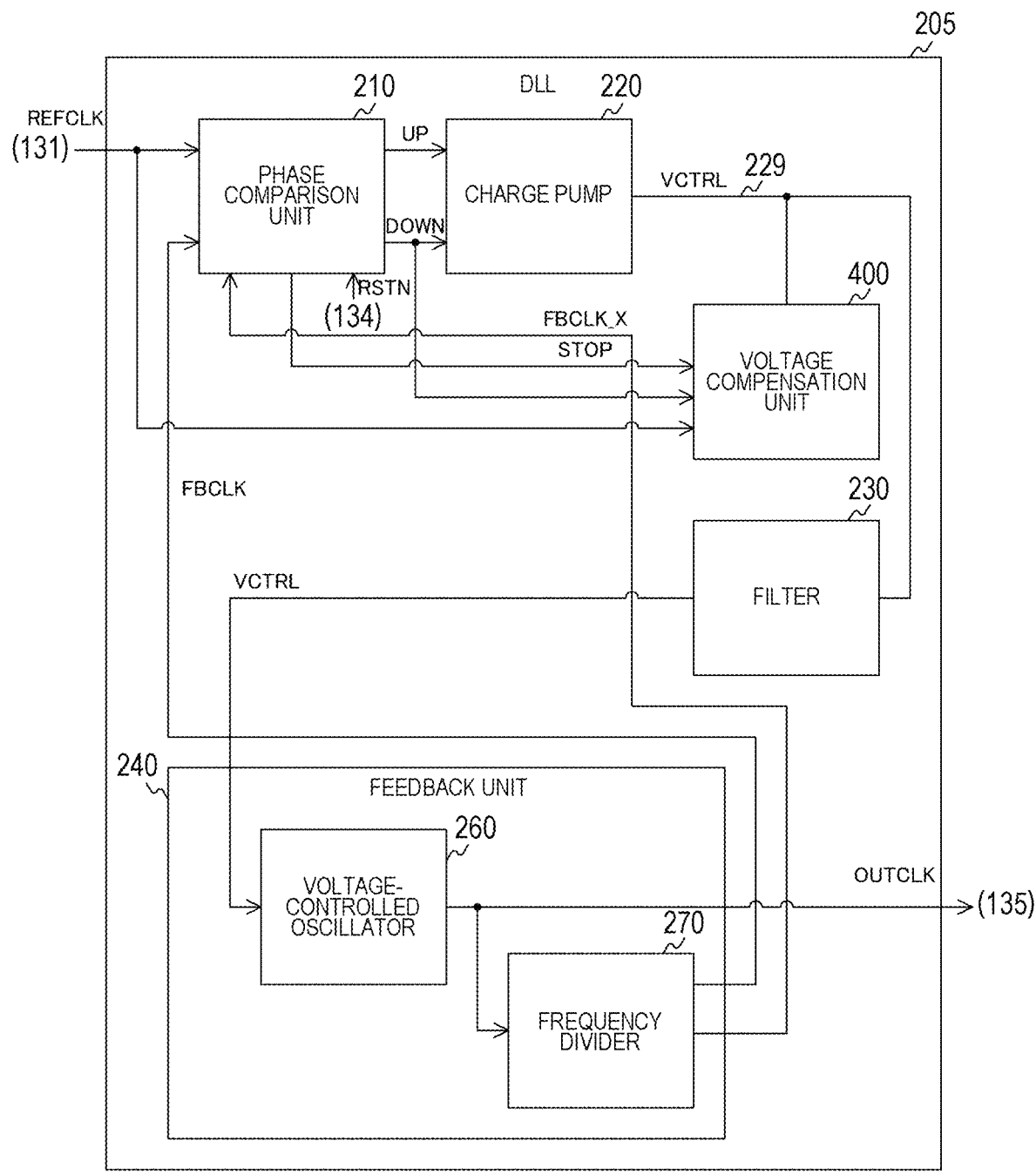
FIG. 35 is a block diagram illustrating a configuration example of a PLL according to the eighth embodiment of the present technology.

FIG. 35 is a block diagram illustrating a configuration example of a PLL 205 according to the ninth embodiment of the present technology. This PLL 205 is provided in a reception circuit 130 or the like. The PLL 205 includes a phase comparison unit 210, a charge pump 220, the voltage compensation unit 400, a filter 230, and a feedback unit 240.

Configurations of the phase comparison unit 210, the charge pump 220, the voltage compensation unit 400, and the filter 230 of the ninth embodiment are similar to those of the sixth embodiment. In the feedback unit 240 of the ninth embodiment, a voltage-controlled oscillator 260 and a frequency divider 270 are disposed.

The voltage-controlled oscillator 260 generates a clock signal having a frequency according to a control voltage VCTRL, and outputs the generated signal to a subsequent circuit as an output clock signal OUTCLK and inputs the signal to the frequency divider 270. The frequency divider 270 divides a frequency of the clock signal to generate a feedback clock signal FBCLK and a feedback clock signal FBCLK_X, and supplies the feedback clock signal FBCLK and the feedback clock signal FBCLK_X to the phase comparison unit 210.

Note that, in FIG. 35, the frequency divider 270 can be reduced as illustrated in FIG. 17.

In this way, according to the ninth embodiment of the present technology, since the voltage compensation unit 400 is disposed in the PLL 205, a recovery time of the PLL 205 can be shortened.

10. Application Example to Mobile Object

The technology (the present technology) according to the present disclosure can be applied to various products. For example, the technology of the present disclosure may be implemented as a device mounted on any type of mobile body such as an automobile, an electric vehicle, a hybrid electric vehicle, a motorcycle, a bicycle, a personal mobility, an airplane, a drone, a ship, a robot, and the like.

Figure 36:
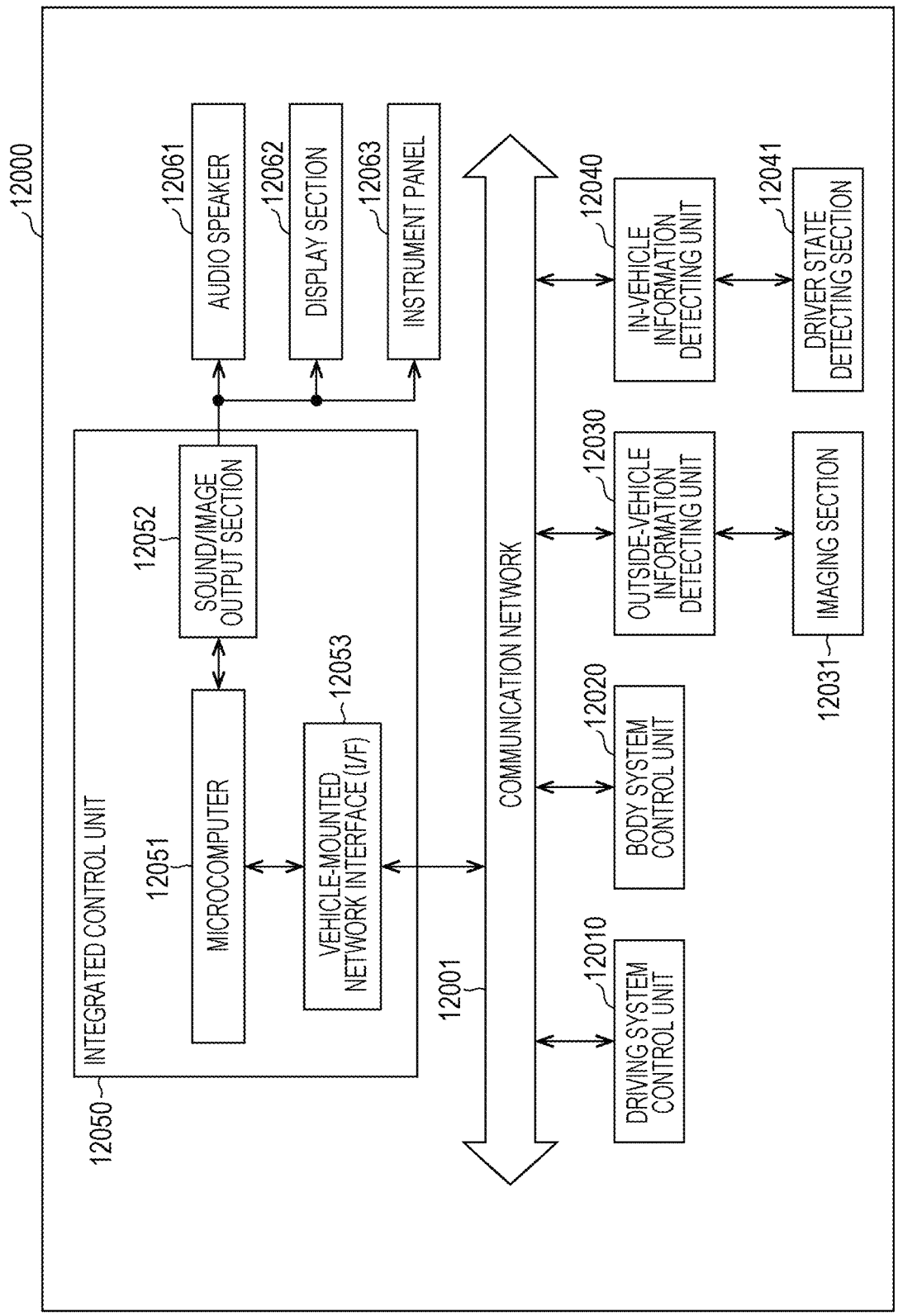
FIG. 36 is a block diagram illustrating a schematic configuration example of a vehicle control system.

FIG. 36 is a block diagram illustrating a schematic configuration example of a vehicle control system as an example of a mobile body control system to which the technology according to the present disclosure is applied.

The vehicle control system 12000 includes a plurality of electronic control units connected to each other via a communication network 12001. In the example illustrated in FIG. 36, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as the functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle acquired by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 36, an audio speaker 12061, a display section 12062, and an instrument panel 12063 are illustrated as the output device. The display section 12062 may, for example, include at least one of an on-board display and a head-up display.

Figure 37:
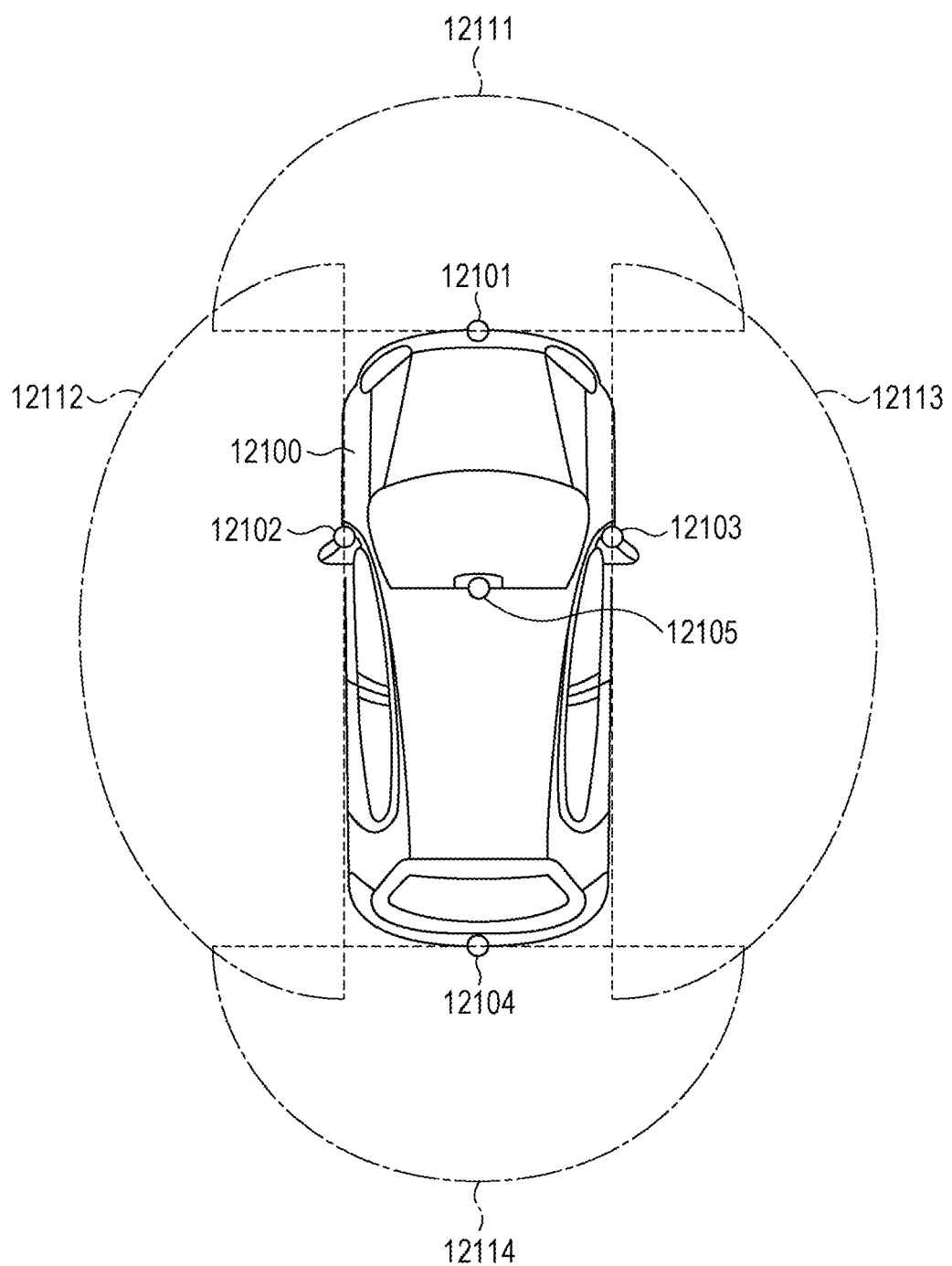
FIG. 37 is an explanatory view illustrating an example of an installation position of an imaging section.

FIG. 37 is a view illustrating an example of an installation position of the imaging section 12031.

In FIG. 37, the imaging section 12031 includes imaging sections 12101, 12102, 12103, 12104, and 12105.

The imaging sections 12101, 12102, 12103, 12104, and 12105 are, for example, provided at positions on a front nose, sideview mirrors, a rear bumper, and a back door of a vehicle 12100 as well as a position on an upper portion of a windshield in the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 37 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology of the present disclosure can be applied has been described above. The technology according to the present disclosure can be applied, for example, to the imaging section 12031 among the configurations described above. Specifically, the imaging device 100 in FIG. 1 can be applied to the imaging section 12031. By applying the technology according to the present disclosure to the imaging section 12031, it is possible to shorten the lock time and speed up the interface.

Note that the embodiments described above illustrate examples for embodying the present technology, and matters in the embodiments and matters specifying the invention in the claims have correspondence relationships. Similarly, the matters specifying the invention in the claims and matters having the same names in the embodiments of the present technology have correspondence relationships. However, the present technology is not limited to the embodiments and can be embodied by making various modifications to the embodiments without departing from the gist thereof.

Note that, effects described in the present specification are merely examples and are not limited, and there may also be other effects.

Note that, the present technology may also have a following configuration.

(1) A semiconductor integrated circuit including:
- a phase comparator configured to compare between a phase of a reference clock signal that has been input and a phase of a feedback clock signal, and output a comparison result;
- a charge pump configured to generate a control voltage for control of a frequency of the feedback clock signal on the basis of the comparison result;
- a feedback unit configured to generate the feedback clock signal in accordance with the control voltage; and
- a stop detection unit configured to detect whether or not the reference clock signal is stopped, and initialize the comparison result in a case where the reference clock signal is stopped.

(2) The semiconductor integrated circuit according to (1) above, in which
- the feedback unit includes a delay unit configured to delay the reference clock signal over a delay time according to the control voltage, and output the reference clock signal as the feedback clock signal.

(3) The semiconductor integrated circuit according to (2) above, in which
- the comparison result includes a first control signal for increase of the control voltage and a second control signal for decrease of the control voltage,
- the phase comparator outputs one of the first and second control signals,
- the stop detection unit includes:
- a pre-stage flip-flop configured to hold the one of the first and second control signals, in synchronization with a clock signal having a delay time different from a delay time of the feedback clock signal; and
- a reset signal generation circuit configured to generate a reset signal for initialization of the comparison result on the basis of a control signal held in the pre-stage flip-flop and the reference clock signal, and
- the phase comparator initializes the comparison result in response to the reset signal.

(4) The semiconductor integrated circuit according to (3) above, in which
the reset signal generation circuit includes:
a delay element configured to delay a control signal held in the pre-stage flip-flop;
a post-stage logic gate configured to generate a predetermined detection signal on the basis of the held control signal and the delayed control signal; and
a post-stage flip-flop configured to capture and hold a predetermined value in synchronization with the reference clock signal, output the held value as the reset signal, and initialize the held value in response to the predetermined detection signal.

(5) The semiconductor integrated circuit according to (3) above, in which
the pre-stage flip-flop outputs a held control signal as a detection signal, and
the reset signal generation circuit includes:
a post-stage flip-flop configured to capture and hold the detection signal in synchronization with the reference clock signal;
an inverter configured to invert a signal held in the post-stage flip-flop and output the signal as an inverted signal; and
a post-stage logic circuit configured to generate the reset signal on the basis of the held detection signal and the inverted signal.

(6) The semiconductor integrated circuit according to any one of (3) to (5) above, further including:
a pre-stage logic gate configured to input any of the first and second control signals to the pre-stage flip-flop when a predetermined period has elapsed from when the control voltage is an initial value.

(7) The semiconductor integrated circuit according to any one of (3) to (6) above, in which
the feedback unit further includes a multiplexer configured to select any clock signal from a plurality of clock signals having different delay times, and supply the clock signal to the pre-stage flip-flop.

(8) The semiconductor integrated circuit according to any one of (1) to (7) above, in which
the feedback unit includes a voltage-controlled oscillator configured to generate, as the feedback clock signal, a clock signal having a frequency according to the control voltage.

(9) The semiconductor integrated circuit according to any one of (1) to (7) above, in which
the feedback unit includes:
a voltage-controlled oscillator configured to generate a clock signal having a frequency according to the control voltage, and output the clock signal as an output clock signal; and
a frequency divider configured to divide a frequency of the output clock signal and output the output clock signal as the feedback clock signal.

(10) The semiconductor integrated circuit according to any one of (1) to (9) above, further including:
a voltage correction unit configured to hold, as a held value, the control voltage of when the comparison result is initialized, and correct the control voltage to the held value when a stop period of the reference clock signal has elapsed.

(11) The semiconductor integrated circuit according to (1) above, further including:
a voltage compensation unit configured to compensate the control voltage on the basis of a fluctuation amount of the control voltage during a stop period of the reference clock signal.

(12) The semiconductor integrated circuit according to (11) above, in which
the voltage compensation unit includes:
a replica circuit configured to generate a compensation amount according to the fluctuation amount during the stop period; and
an arithmetic unit configured to compensate the control voltage with the compensation amount, when the stop period has elapsed.

(13) The semiconductor integrated circuit according to (12) above, in which
the arithmetic unit includes:
an operational amplifier;
first and second capacitive elements having one ends connected in common to an input terminal of the operational amplifier;
a first switch configured to open and close a path between a control line that supplies the control voltage and another end of the first capacitive element;
a second switch configured to open and close a path between the replica circuit and another end of the second capacitive element;
a third switch configured to open and close a path between the another end of the first capacitive element and an output terminal of the operational amplifier;
a fourth switch configured to open and close a path between the input terminal and the output terminal of the operational amplifier;
a fifth switch configured to open and close a path between the another end of the second capacitive element and a predetermined reference potential; and
a sixth switch configured to open and close a path between the control line and an output terminal of the operational amplifier.

(14) The semiconductor integrated circuit according to (11) above, in which
the voltage compensation unit includes:
a replica circuit configured to generate a compensation amount according to the fluctuation amount during the stop period; and
an arithmetic unit configured to compensate the control voltage with the compensation amount, when the stop period has elapsed.

(15) The semiconductor integrated circuit according to any one of (11) to (14) above, in which
the feedback unit includes:
a voltage-controlled oscillator configured to generate a clock signal having a frequency according to the control voltage, and output the clock signal as an output clock signal; and
a frequency divider configured to divide a frequency of the output clock signal and output the output clock signal as the feedback clock signal.

(16) An electronic device including:
a phase comparator configured to compare between a phase of a reference clock signal that has been input and a phase of a feedback clock signal, and output a comparison result;
a charge pump configured to generate a control voltage for control of a frequency of the feedback clock signal on the basis of the comparison result;
a feedback unit configured to generate the feedback clock signal in accordance with the control voltage;

a stop detection unit configured to detect whether or not the reference clock signal is stopped, and initialize the comparison result in a case where the reference clock signal is stopped; and a transmission circuit configured to supply the reference clock signal.

(17) A control method for a semiconductor integrated circuit, the control method including:

a phase comparison procedure of comparing between a phase of a reference clock signal that has been input and a phase of a feedback clock signal, and outputting a comparison result;

a voltage generation procedure of generating a control voltage for control of a frequency of the feedback clock signal on the basis of the comparison result;

a feedback procedure of generating the feedback clock signal in accordance with the control voltage; and a stop detection procedure of detecting whether or not the reference clock signal is stopped, and initializing the comparison result in a case where the reference clock signal is stopped.

REFERENCE SIGNS LIST

100 Imaging device
110 Solid-state imaging element
111, 141 Transmission circuit
112, 130 Reception circuit
113 Internal circuit
120 Reception device
131 to 133 Receiver
134 Control unit
135, 136, 311, 312, 316, 317, 321, 323, 334, 336, 442 Flip-flop
140 Transmission device
200 DLL
205 PLL
210 Phase comparison unit
220 Charge pump
221, 224, 421, 424 Current source
222, 223, 423 nMOS transistor
225, 422 pMOS transistor
230 Filter
240 Feedback unit
241 Multiplexer
250 Delay unit
251, 252, 331 Delay element
260 Voltage-controlled oscillator
270 Frequency divider
280 Voltage correction unit
281 Sample-and-hold circuit
282 Analog-to-digital converter
283, 414 Logic circuit
284 Digital-to-analog converter
285, 431 to 436 Switch
310 Phase comparator
313, 319, 322, 325, 339, 441, 444 AND gate
314, 338 NAND gate
315, 324, 337, 411, 443 Inverter
318 NOR gate
320 Stop detection unit
330 Reset signal generation circuit
332, 333 Logic gate
400 Voltage compensation unit
412, 413, 437, 438 Capacitive element
415 Comparator
416 Pulse generator
420 Replica circuit
430 Adder
439 Operational amplifier
440 Recovery-time phase comparator control circuit
12031 Imaging section

The invention claimed is:

1. A semiconductor integrated circuit comprising:

a phase comparator configured to compare between a phase of a reference clock signal that has been input and a phase of a feedback clock signal, and output a comparison result;

a charge pump configured to generate a control voltage for control of a frequency of the feedback clock signal on a basis of the comparison result;

a feedback unit configured to generate the feedback clock signal in accordance with the control voltage; and a stop detection unit configured to detect whether or not the reference clock signal is stopped, and initialize the comparison result in a case where the reference clock signal is stopped.

2. The semiconductor integrated circuit according to claim 1, wherein the feedback unit includes a delay unit configured to delay the reference clock signal over a delay time according to the control voltage, and output the reference clock signal as the feedback clock signal.

3. The semiconductor integrated circuit according to claim 2, wherein the comparison result includes a first control signal for increase of the control voltage and a second control signal for decrease of the control voltage, the phase comparator outputs one of the first and second control signals, the stop detection unit includes:

a pre-stage flip-flop configured to hold the one of the first and second control signals, in synchronization with a clock signal having a delay time different from a delay time of the feedback clock signal; and a reset signal generation circuit configured to generate a reset signal for initialization of the comparison result on a basis of a control signal held in the pre-stage flip-flop and the reference clock signal, and the phase comparator initializes the comparison result in response to the reset signal.

4. The semiconductor integrated circuit according to claim 3, wherein the reset signal generation circuit includes:

a delay element configured to delay a control signal held in the pre-stage flip-flop;

a post-stage logic gate configured to generate a predetermined detection signal on a basis of the held control signal and the delayed control signal; and a post-stage flip-flop configured to capture and hold a predetermined value in synchronization with the reference clock signal, output the held predetermined value as the reset signal, and initialize the held predetermined value in response to the predetermined detection signal.

5. The semiconductor integrated circuit according to claim 3, wherein the pre-stage flip-flop outputs a held control signal as a detection signal, and the reset signal generation circuit includes:

a post-stage flip-flop configured to capture and hold the detection signal in synchronization with the reference clock signal;

an inverter configured to invert a signal held in the post-stage flip-flop and output the signal as an inverted signal; and a post-stage logic circuit configured to generate the reset signal on a basis of the held detection signal and the inverted signal.

6. The semiconductor integrated circuit according to claim 3, further comprising:

a pre-stage logic gate configured to input any of the first and second control signals to the pre-stage flip-flop when a predetermined period has elapsed from when the control voltage is an initial value.

7. The semiconductor integrated circuit according to claim 3, wherein the feedback unit further includes a multiplexer configured to select any clock signal from a plurality of clock signals having different delay times, and supply the clock signal to the pre-stage flip-flop.

8. The semiconductor integrated circuit according to claim 1, wherein the feedback unit includes a voltage-controlled oscillator configured to generate, as the feedback clock signal, a clock signal having a frequency according to the control voltage.

9. The semiconductor integrated circuit according to claim 1, wherein the feedback unit includes:

a voltage-controlled oscillator configured to generate a clock signal having a frequency according to the control voltage, and output the clock signal as an output clock signal; and a frequency divider configured to divide the frequency of the output clock signal and output the output clock signal as the feedback clock signal.

10. The semiconductor integrated circuit according to claim 1, further comprising:

a voltage correction unit configured to hold, as a held value, the control voltage of when the comparison result is initialized, and correct the control voltage to the held value when a stop period of the reference clock signal has elapsed.

11. The semiconductor integrated circuit according to claim 1, further comprising:

a voltage compensation unit configured to compensate the control voltage on a basis of a fluctuation amount of the control voltage during a stop period of the reference clock signal.

12. The semiconductor integrated circuit according to claim 11, wherein the comparison result includes a first control signal for increase of the control voltage and a second control signal for decrease of the control voltage, the stop detection unit initializes one of the first and second control signals when a predetermined period has elapsed from a start of output of the one of the first and second control signals during the stop period, and the voltage compensation unit initializes another one of the first and second control signals when the predetermined period has elapsed from a start of output of the another one of the first and second control signals after elapse of the stop period.

13. The semiconductor integrated circuit according to claim 12, wherein an arithmetic unit includes:

an operational amplifier;

first and second capacitive elements having one ends connected in common to an input terminal of the operational amplifier;

a first switch configured to open and close a path between a control line that supplies the control voltage and another end of the first capacitive element;

a second switch configured to open and close a path between the replica circuit and another end of the second capacitive element;

a third switch configured to open and close a path between the another end of the first capacitive element and an output terminal of the operational amplifier;

a fourth switch configured to open and close a path between the input terminal and the output terminal of the operational amplifier;

a fifth switch configured to open and close a path between the another end of the second capacitive element and a predetermined reference potential; and a sixth switch configured to open and close a path between the control line and the output terminal of the operational amplifier.

14. The semiconductor integrated circuit according to claim 11, wherein the voltage compensation unit includes:

a replica circuit configured to generate a compensation amount according to the fluctuation amount during the stop period; and an arithmetic unit configured to compensate the control voltage with the compensation amount, when the stop period has elapsed.

15. The semiconductor integrated circuit according to claim 11, wherein the feedback unit includes:

a voltage-controlled oscillator configured to generate a clock signal having a frequency according to the control voltage, and output the clock signal as an output clock signal; and a frequency divider configured to divide the frequency of the output clock signal and output the output clock signal as the feedback clock signal.

16. An electronic device comprising:

a phase comparator configured to compare between a phase of a reference clock signal that has been input and a phase of a feedback clock signal, and output a comparison result;

a charge pump configured to generate a control voltage for control of a frequency of the feedback clock signal on a basis of the comparison result;

a feedback unit configured to generate the feedback clock signal in accordance with the control voltage;

a stop detection unit configured to detect whether or not the reference clock signal is stopped, and initialize the comparison result in a case where the reference clock signal is stopped; and a transmission circuit configured to supply the reference clock signal.

17. A control method for a semiconductor integrated circuit, the control method comprising:

a phase comparison procedure of comparing between a phase of a reference clock signal that has been input and a phase of a feedback clock signal, and outputting a comparison result;

a voltage generation procedure of generating a control voltage for control of a frequency of the feedback clock signal on a basis of the comparison result;

a feedback procedure of generating the feedback clock signal in accordance with the control voltage; and a stop detection procedure of detecting whether or not the reference clock signal is stopped, and initializing the comparison result in a case where the reference clock signal is stopped.

* * * * *